United States Patent
Tan et al.

(10) Patent No.: US 10,749,103 B2
(45) Date of Patent: Aug. 18, 2020

(54) DRY PLASMA ETCH METHOD TO PATTERN MRAM STACK

(71) Applicant: Lam Research Corporation, Fremont, CA (US)

(72) Inventors: Samantha Tan, Fremont, CA (US); Taeseung Kim, Fremont, CA (US); Wenbing Yang, Campbell, CA (US); Jeffrey Marks, Saratoga, CA (US); Thorsten Lill, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 16/449,141

(22) Filed: Jun. 21, 2019

(65) Prior Publication Data

US 2019/0312194 A1    Oct. 10, 2019

Related U.S. Application Data

(62) Division of application No. 15/719,497, filed on Sep. 28, 2017, now Pat. No. 10,374,144, which is a division of application No. 14/749,291, filed on Jun. 24, 2015, now Pat. No. 9,806,252.

(60) Provisional application No. 62/150,053, filed on Apr. 20, 2015.

(51) Int. Cl.
*H01L 41/47* (2013.01)
*H01L 27/22* (2006.01)
*C23F 1/12* (2006.01)
*C23F 4/00* (2006.01)
(Continued)

(52) U.S. Cl.
CPC .............. *H01L 41/47* (2013.01); *C23F 1/12* (2013.01); *C23F 4/00* (2013.01); *H01J 37/32082* (2013.01); *H01J 37/32422* (2013.01); *H01J 37/32651* (2013.01); *H01L 27/222* (2013.01); *H01L 43/12* (2013.01)

(58) Field of Classification Search
None
See application file for complete search history.

(56) References Cited

U.S. PATENT DOCUMENTS

| | | |
|---|---|---|
| 4,592,801 A | 6/1986 | Hara et al. |
| 5,282,925 A | 2/1994 | Jeng et al. |
| 5,298,451 A | 3/1994 | Rao |

(Continued)

FOREIGN PATENT DOCUMENTS

| | | |
|---|---|---|
| CN | 1550575 A | 12/2004 |
| CN | 1552097 A | 12/2004 |

(Continued)

OTHER PUBLICATIONS

U.S. Office Action dated May 5, 2016 issued in U.S. Appl. No. 14/749,285.

(Continued)

*Primary Examiner* — Allan W. Olsen
(74) *Attorney, Agent, or Firm* — Beyer Law Group LLP

(57) ABSTRACT

Apparatuses for etching metal by depositing a material reactive with a metal to be etched and a halogen to form a volatile species and exposing the substrate to a halogen-containing gas and activation gas to etch the substrate are provided. Deposited materials may include silicon, germanium, titanium, carbon, tin, and combinations thereof. Apparatuses are suitable for fabricating MRAM structures and may be used to integrate ALD and ALE processes without breaking vacuum.

10 Claims, 11 Drawing Sheets

(51) Int. Cl.
*H01J 37/32* (2006.01)
*H01L 43/12* (2006.01)

(56) References Cited

U.S. PATENT DOCUMENTS

| | | | |
|---|---|---|---|
| 5,411,631 | A | 5/1995 | Hori et al. |
| 5,501,893 | A | 3/1996 | Laermer et al. |
| 5,766,971 | A | 6/1998 | Ahlgren et al. |
| 6,022,806 | A | 2/2000 | Sato et al. |
| 6,083,413 | A | 7/2000 | Sawub et al. |
| 6,177,353 | B1 | 1/2001 | Gutsche et al. |
| 6,448,192 | B1 | 9/2002 | Kaushik |
| 6,482,745 | B1 | 11/2002 | Hwang |
| 6,677,242 | B1 | 1/2004 | Liu et al. |
| 7,115,522 | B2 | 10/2006 | Tomioka et al. |
| 7,196,955 | B2 | 3/2007 | Nickel |
| 7,416,989 | B1 | 8/2008 | Liu et al. |
| 7,795,148 | B2 | 9/2010 | Brown |
| 8,252,194 | B2 | 8/2012 | Kiehlbauch et al. |
| 8,622,020 | B2 | 1/2014 | Thie et al. |
| 8,808,561 | B2 | 8/2014 | Kanarik |
| 8,883,028 | B2 | 11/2014 | Kanarik |
| 8,993,352 | B2 | 3/2015 | Nishimura et al. |
| 9,130,158 | B1 | 9/2015 | Shen et al. |
| 9,257,638 | B2 | 2/2016 | Tan et al. |
| 9,449,843 | B1 | 9/2016 | Korolik et al. |
| 9,576,811 | B2 | 2/2017 | Kanarik et al. |
| 9,805,941 | B2 | 10/2017 | Kanarik et al. |
| 9,806,252 | B2 | 10/2017 | Tan et al. |
| 9,837,312 | B1 | 12/2017 | Tan et al. |
| 9,870,899 | B2 | 1/2018 | Yang et al. |
| 9,972,504 | B2 | 5/2018 | Yang et al. |
| 9,991,128 | B2 | 6/2018 | Tan et al. |
| 9,997,371 | B1 | 6/2018 | Agarwal et al. |
| 10,096,487 | B2 | 10/2018 | Yang et al. |
| 10,186,426 | B2 | 1/2019 | Tan et al. |
| 10,374,144 | B2 | 8/2019 | Tan et al. |
| 2001/0053585 | A1 | 12/2001 | Kikuchi et al. |
| 2002/0009883 | A1 | 1/2002 | Ogure et al. |
| 2002/0058409 | A1 | 5/2002 | Lin et al. |
| 2002/0081381 | A1 | 6/2002 | DelaRosa et al. |
| 2003/0034244 | A1 | 2/2003 | Yasar et al. |
| 2004/0004056 | A1 | 1/2004 | Sasaki et al. |
| 2004/0137749 | A1 | 7/2004 | Ying et al. |
| 2004/0209476 | A1 | 10/2004 | Ying et al. |
| 2005/0006222 | A1 | 1/2005 | Ding et al. |
| 2005/0098440 | A1 | 5/2005 | Kailasam et al. |
| 2005/0167399 | A1 | 8/2005 | Ludviksson et al. |
| 2006/0009040 | A1 | 1/2006 | Tomioka et al. |
| 2006/0152967 | A1 | 7/2006 | Nickel |
| 2006/0169669 | A1 | 8/2006 | Zojaji et al. |
| 2006/0194435 | A1 | 8/2006 | Nishimura et al. |
| 2007/0049036 | A1 | 3/2007 | Huang |
| 2007/0202254 | A1 | 8/2007 | Ganguli et al. |
| 2007/0238301 | A1 | 10/2007 | Cabral et al. |
| 2007/0246442 | A1 | 10/2007 | America et al. |
| 2009/0020884 | A1 | 1/2009 | Lee et al. |
| 2009/0226611 | A1 | 9/2009 | Suzuki et al. |
| 2009/0256220 | A1 | 10/2009 | Horng et al. |
| 2011/0139748 | A1 | 6/2011 | Donnelly et al. |
| 2011/0212274 | A1 | 9/2011 | Selsley |
| 2012/0009785 | A1 | 1/2012 | Chandrashekar et al. |
| 2012/0115329 | A1 | 5/2012 | Chandrashekar et al. |
| 2012/0276657 | A1 | 11/2012 | Joubert et al. |
| 2013/0105303 | A1 | 5/2013 | Lubomirsky et al. |
| 2013/0129922 | A1 | 5/2013 | Sasagawa et al. |
| 2013/0137267 | A1 | 5/2013 | Chang et al. |
| 2013/0168354 | A1 | 7/2013 | Kanarik |
| 2014/0170853 | A1 | 6/2014 | Shamma et al. |
| 2014/0349469 | A1 | 11/2014 | Sasagawa et al. |
| 2015/0037972 | A1 | 2/2015 | Danek et al. |
| 2015/0111374 | A1 | 4/2015 | Bao et al. |
| 2015/0214474 | A1 | 7/2015 | Nishimura et al. |
| 2015/0235835 | A1 | 8/2015 | Swaminathan et al. |
| 2015/0243883 | A1 | 8/2015 | Swaminathan et al. |
| 2015/0270140 | A1 | 9/2015 | Gupta et al. |
| 2016/0013063 | A1 | 1/2016 | Ranjan et al. |
| 2016/0020152 | A1 | 1/2016 | Posseme |
| 2016/0056074 | A1 | 2/2016 | Na et al. |
| 2016/0064244 | A1 | 3/2016 | Agarwal et al. |
| 2016/0079521 | A1 | 3/2016 | Draeger et al. |
| 2016/0203995 | A1 | 7/2016 | Kanarik et al. |
| 2016/0308112 | A1 | 10/2016 | Tan et al. |
| 2016/0314985 | A1 | 10/2016 | Yang et al. |
| 2016/0358782 | A1 | 12/2016 | Yang et al. |
| 2016/0379824 | A1 | 12/2016 | Wise et al. |
| 2017/0040214 | A1 | 2/2017 | Lai et al. |
| 2017/0053810 | A1 | 2/2017 | Yang et al. |
| 2017/0069462 | A1 | 3/2017 | Kanarik et al. |
| 2017/0084822 | A1 | 3/2017 | Kim et al. |
| 2017/0117159 | A1 | 4/2017 | Kanarik et al. |
| 2017/0125256 | A1 | 5/2017 | Lee et al. |
| 2017/0229311 | A1 | 8/2017 | Tan et al. |
| 2017/0229314 | A1 | 8/2017 | Tan et al. |
| 2018/0019387 | A1 | 1/2018 | Tan et al. |
| 2018/0033635 | A1 | 2/2018 | Kanarik et al. |
| 2018/0102236 | A1 | 4/2018 | Yang et al. |
| 2018/0174860 | A1 | 6/2018 | Kanarik et al. |
| 2018/0240682 | A1 | 8/2018 | Lai et al. |
| 2018/0308680 | A1 | 10/2018 | Reddy et al. |
| 2018/0308695 | A1 | 10/2018 | LaVoie |
| 2018/0350624 | A1 | 12/2018 | Kanarik et al. |
| 2019/0139778 | A1 | 5/2019 | Kanarik et al. |

FOREIGN PATENT DOCUMENTS

| | | |
|---|---|---|
| CN | 1568376 A | 1/2005 |
| CN | 101015047 A | 8/2007 |
| CN | 101388359 A | 3/2009 |
| CN | 101809711 A | 8/2010 |
| EP | 0987745 A1 | 3/2000 |
| EP | 1469511 A2 | 10/2004 |
| JP | 06-326060 A | 11/1994 |
| JP | 5416280 B2 | 2/2014 |
| TW | 2011/40687 A | 11/2011 |
| TW | 2013/40209 A | 10/2013 |
| WO | WO 9936956 A1 | 7/1999 |
| WO | WO 02/091461 A2 | 11/2002 |
| WO | WO 03/031674 A1 | 4/2003 |
| WO | WO 2011/081921 A2 | 7/2011 |
| WO | WO 2016/100873 A1 | 6/2016 |

OTHER PUBLICATIONS

U.S. Final Office Action dated Sep. 23, 2016 issued in U.S. Appl. No. 14/749,285.
U.S. Office Action dated Feb. 17, 2017 issued in U.S. Appl. No. 14/749,285.
U.S. Final Office Action dated Mar. 30, 2017 issued in U.S. Appl. No. 14/749,285.
U.S. Office Action dated Aug. 11, 2017 issued in U.S. Appl. No. 14/749,285.
U.S. Notice of Allowance dated Sep. 29, 2017 issued in U.S. Appl. No. 14/749,285.
U.S. Office Action dated Nov. 28, 2016 issued in U.S. Appl. No. 14/749,291.
U.S. Notice of Allowance dated Jun. 30, 2017 issued in U.S. Appl. No. 14/749,291.
U.S. Office Action dated Dec. 14, 2018 issued in U.S. Appl. No. 15/719,497.
U.S. Notice of Allowance dated Mar. 22, 2019 issued in U.S. Appl. No. 15/719,497.
U.S. Office Action dated Jul. 1, 2016 issued in U.S. Appl. No. 14/830,683.
U.S. Final Office Action dated Feb. 7, 2017 issued in U.S. Appl. No. 14/830,683.
U.S. Office Action dated Jul. 25, 2017 issued in U.S. Appl. No. 14/830,683.
U.S. Notice of Allowance dated Jan. 11, 2018 issued in U.S. Appl. No. 14/830,683.

(56) References Cited

OTHER PUBLICATIONS

U.S. Office Action dated May 1, 2019 issued in U.S. Appl. No. 15/954,509.
U.S. Office Action dated Aug. 25, 2017 issued in U.S. Appl. No. 15/239,138.
U.S. Notice of Allowance dated May 10, 2018 issued in U.S. Appl. No. 15/239,138.
U.S. Office Action dated Nov. 29, 2017 issued in U.S. Appl. No. 15/421,189.
U.S. Notice of Allowance dated Apr. 25, 2018 issued in U.S. Appl. No. 15/421,189.
U.S. Office Action dated Mar. 24, 2017 issued in U.S. Appl. No. 15/286,421.
U.S. Notice of Allowance dated Sep. 28, 2017 issued in U.S. Appl. No. 15/286,421.
U.S. Notice of Allowance [Supplemental] dated Oct. 26, 2017 issued in U.S. Appl. No. 15/286,421.
U.S. Office Action dated Apr. 10, 2019 issued in U.S. Appl. No. 15/841,205.
PCT International Search Report and Written Opinion dated Feb. 25, 2016 issued in PCT/US2015/066789.
Chinese First Office Action dated Jun. 26, 2018 issued in Application No. CN 201610255293.7.
Chinese Second Office Action dated Feb. 3, 2019 issued in Application No. CN 201610255293.7.
Singapore Search Report and Written Opinion dated Jul. 9, 2018 issued in Application No. SG 10201603092R.
Chinese First Office Action dated Mar. 30, 2018 issued in CN 201610248296.8.
Chinese Second Office Action dated Dec. 27, 2018 issued in CN 201610248296.8.
Singapore Search Report and Written Opinion dated Jun. 28, 2018 issued in SG 10201603090V.
Chinese First Office Action dated Aug. 28, 2018 issued in CN 201610643282.6.
Chinese Second Office Action dated Apr. 22, 2019 issued in CN CN 201610643282.6.
Chinese First Office Action dated Jan. 9, 2019 issued in CN 201610694927.9.
International Search Report and Written Opinon dated Apr. 5, 2018 issued in PCT/US2017/066470.
Boullart et al. (Mar. 29, 2013) "STT MRAM patterning challenges," *Proc. SPIE, Advanced Etch Technology for Nanopatterning II, Proc. of SPIE* 8685:86850F-1-86850F-9 [Retrieved on Jun. 2, 2015 from http://proceedings.spiedigitallibrary.org].
Carver et al. (Feb. 20, 2015) "Atomic Layer Etching: An Industry Perspective," *ECS Journal of Solid State Science and Technology*,4(6):N5005-N5009.
Ditizio, Robert and Werbaneth, Paul, Tegal Corporation and Zhu, Jian-Gang, Carnegie Mellon University (Jan. 2004) "Cell Shape and Patterning Considerations for Magnetic Random Access Memory (MRAM) Fabrication," Reprinted with permission from *Semiconductor Manufacturing Magazine*, 7 pp.
Faraz et al., (Mar. 24, 2015) "Atomic Layer Etching: What Can We Learn from Atomic Layer Deposition?," *ECS Journal of Solid State Science and Technology*, 4(6):N5023-N5032.
Jiang et al. (1998) "Complexes Containing Unbridged Dative Metal-Metal Bonds and the Strong Acceptor $Ru(CO)_3(SiCl_3)_2$ Moiety. Comments on the Transition Metal to Silicon Bond," *Organometallics*, 17(26):5810-5819.
Kanarik et al. (Aug. 2018) "Atomic Layer Etching: Rethinking the Art of Etch" The Journal of Physical Chemistry Letters, vol. 9, pp. 4814-4821. <doi:10.1021/acs.jpclett.8b00997>.
Kanarik et al. (Mar./Apr. 2015) "Overview of atomic layer etching in the semiconductor industry," *J. Vac. Sci. Technol. A* 33(2):020802-1-020802-14.
Kanarik et al. (2017) "Predicting synergy in atomic layer etching," *J. Vac. Sci. Technol. A*,35(5):05C302-1 through 05C302-7.
Lee et al. (2015) "Atomic Layer Etching of $Al_2O_3$ Using Sequential, Self-Limiting Thermal Reactions with $Sn(acac)_2$ and Hydrogen Fluoride," $^{ACS}$ *NANO*,9(2):2061-2070.
Pomeroy, R.K. and Wijesekera, K.S. (1980) "Preparation and derivatives of $cis-M(CO)_4(SiCl_3)_2$ (M=Fe, Ru, Os)," *Inorg. Chem.*, 19(12):3729-3735.
Schmitt et al. (2006) "Synthesis and Properties of Single-Crystal FeSi Nanowires," *Nano Lett.*, 6(8):1617-1621.
Schmitt et al. (Feb. 1, 2008) "Chemical Synthesis and Magnetotransport of Magnetic Semiconducting $Fe_{1-x}Co_xSi$ Alloy Nanowires," *Nano Lett.*, 8(3):810-815.
Wolf, S. and Tauber, R.N. (1986) "Silicon Processing for the VLSI Era," *vol. 1—Process Technology, Lattice Press*, pp. 542-557.
U.S. Office Action dated Jun. 17, 2016 issued in U.S. Appl. No. 14/696,254.
U.S. Notice of Allowance dated Oct. 14, 2016 issued in U.S. Appl. No. 14/696,254.
U.S. Notice of Allowance dated Jun. 29, 2017 issued in U.S. Appl. No. 15/400,368.
U.S. Office Action dated Mar. 29, 2018 issued in U.S. Appl. No. 15/719,484.
U.S. Notice of Allowance dated Sep. 11, 2018 issued in U.S. Appl. No. 15/719,484.
U.S. Office Action dated May 31, 2019 issued in U.S. Appl. No. 16/220,583.
U.S. Office Action dated Oct. 10, 2018 issued in U.S. Appl. No. 15/423,486.
U.S. Office Action dated Feb. 26, 2019 issued in U.S. Appl. No. 15/423,486.
U.S. Notice of Allowance dated Oct. 6, 2017 issued in U.S. Appl. No. 15/582,359.
U.S. Notice of Allowance dated Jan. 26, 2018 issued in U.S. Appl. No. 15/582,359.
U.S. Office Action dated Nov. 1, 2018 issued in U.S. Appl. No. 15/581,951.
Chinese First Office Action dated Dec. 27, 2017 issued in Application No. CN 201610017911.4.
Chinese Second Office Action dated Aug. 31, 2018 issued in Application No. CN 201610017911.4.
Chinese Third Office Action dated Mar. 4, 2019 issued in Application No. CN 201610017911.4.
Singapore Search Report and Written Opinion dated Jun. 14, 2018 issued in Application No. SG 10201600099V.
Happich, J., et al., (2018) "Atomic layer etching yields 2.5nm wide FinFETs," eeNews Europe, pp. 1-4. [retrieved on Dec. 12, 2018] <URL:http://www.eenewseurope.com/news/atomic-layer-etching-yields-25nm-wide-finfets#>.
Puurunen, Rikka L. (2005) "Surface chemistry of atomic layer deposition: A case study for the trimethylaluminum/water process," *Journal of Applied Physics*, 97:121301—51 pages.
Gottscho, Richard (Jul. 16, 2017) "Atomic Layer Etching—An Overview of Possibilities and Limitations," *Plenary Talk presented at American Vacuum Society 17th International Conference on Atomic Layer Deposition (ALD 2017) and 4th International Atomic Layer Etching Workshop (ALE 2017)*, Lam Research Corp., 21pp.
U.S. Final Office Action dated Jun. 19, 2019 issued in U.S. Appl. No. 15/581,951.
Taiwan First Office Action dated Jul. 19, 2019 issued in Application No. TW 105100640.
Chinese Second Office Action dated Jun. 17, 2019 issued in CN 201610694927.9.
Chinese Office Action from Chinese Application No. 201810953048.2 dated Mar. 19, 2020.
Taiwanese Office Action from Taiwanese Application No. 105111956 dated Aug. 30, 2019.
Singapore Search Report and Written Opinion Application No. 10201603090V dated Jun. 20, 2018.

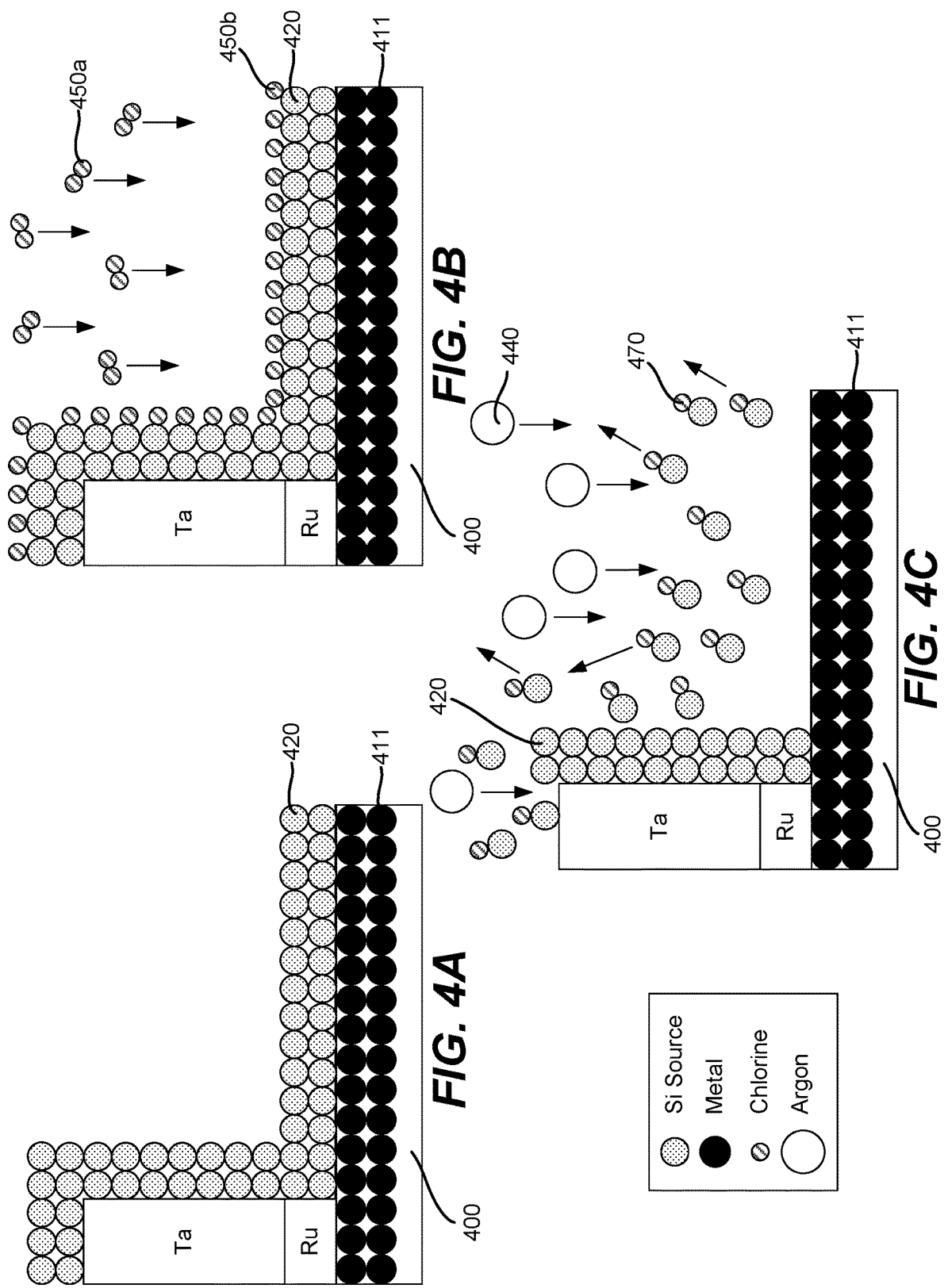

DRY PLASMA ETCH METHOD TO PATTERN MRAM STACK

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in their entireties and for all purposes.

BACKGROUND

Semiconductor fabrication processes include etching of various materials, including metals and metal alloys. However, as devices shrink and fabrication of various types of structures become more complex, some etched byproducts may re-deposit onto other exposed regions of a substrate, which may cause defects and eventual device failure. As a result, other etching techniques are of interest.

SUMMARY

Provided herein are methods of processing substrates. One aspect involves a method including: (a) exposing a substrate situated in a chamber to a halogen-containing gas to modify the surface of the substrate, (b) exposing the substrate to an activation gas and an activation source to etch one or more layers on the substrate, and (c) during (a) and (b), providing to the chamber a reactive material that is reactive with both the halogen-containing gas and a material of the one or more layers on the substrate to form a volatile species.

In some embodiments, the reactive material in (c) is silicon-containing material, titanium-containing material, germanium-containing material, tin-containing material, carbon-containing material, and/or combinations thereof. The halogen-containing gas may be any of $Cl_2$, $BCl_3$, $BBr_3$, $BI_3$, $F_2$, $BF_3$, $Br_2$, $I_2$, and combinations thereof. In various embodiments, the halogen-containing gas is a halide gas.

In various embodiments, (a) and (b) are repeated in two or more cycles. In some embodiments, (a)-(c) are performed without breaking vacuum. In some embodiments, (c) mitigates re-deposition of metal-containing byproducts.

The material of the one or more layers of the substrate may be any of Period IV transition metals, Period V transition metals, Period VI transition metals, and combinations thereof. In some embodiments, the material of the one or more layers of the substrate includes dielectric material. The metal and the dielectric material may be adjacent layers on the substrate. For example, in some embodiments, the dielectric material is MgO and the dielectric material is adjacent to both a layer including CoFe and a layer including CoPt. In some embodiments, the method further includes (d) etching the metal layer to a remaining thickness of between about 0 Å and about 10 Å; and (e) after etching the metal layer, etching the dielectric material by exposing the substrate to the activation gas and the activation source without exposing the dielectric material to the halogen-containing gas. The activation gas in (e) may be any of argon, carbon dioxide, ammonia, hydrogen-containing gas, and combinations thereof.

In various embodiments, the reactive material is the titanium-containing material and is titanium oxide or titanium nitride. The reactive material may be the silicon-containing material and be any of silicon nitride, silicon oxide or silicon.

In various embodiments, the two or more cycles etch a first set of metal layers and a dielectric layer, and whereby (c) is performed after etching the dielectric layer and before etching a second set of metal layers underlying the dielectric layer. In some embodiments, (c) is repeated after (a) and (b) are repeated in the two or more cycles.

The activation source may be a plasma and power of the plasma during (c) may be between about 500 W and about 1500 W.

The reactive material may be deposited by plasma enhanced chemical vapor deposition. In some embodiments, the reactive material is deposited by atomic layer deposition. The reactive material may be deposited conformally. In various embodiments, the reactive material is deposited by a self-limiting reaction. In various embodiments, the halogen-containing gas substantially saturates the surface of the substrate during (a).

The reactive material may substantially saturate the surface of the substrate during (c). In some embodiments, reactive material remains on sidewalls of features of the substrate during the etch. The reactive material may protect at least one of the one or more layers of the substrate during the etch. In some embodiments, the reactive material is deposited to a thickness between about 3 nm and about 6 nm.

In various embodiments, the substrate is etched to form an MRAM structure.

The method may further include applying a bias during (c) at a power less than about 100 Vb. The activation source may be any of plasma, ion-beam etching, and thermal activation.

In some embodiments, the method further includes wet etching the substrate. The method may further include etching by reactive ion etching. In some embodiments, the reactive material is provided to the chamber by providing a solid silicon source.

In various embodiments, the method further includes: (d) performing (c) by conformally depositing a silicon nitride layer by plasma enhanced chemical vapor deposition over the substrate prior to performing (a) and (b); and (e) after (d), repeating (a) and (b) in two or more cycles, whereby the halogen-containing gas in (a) is a combination of $BCl_3$ and $Cl_2$. The method may further include: (f) performing (c) by conformally depositing a material reactive with both the halogen-containing gas and a material of the one or more layers on the substrate to form a volatile species when a metal layer adjacent to a dielectric layer has been etched to a remaining thickness between about 0 Å and about 10 Å; (g) sputtering the substrate with an activation gas without exposing the substrate to the halogen-containing gas to etch a dielectric layer including MgO; and (h) after (g), repeating (a) and (b) in two or more cycles to etch at least one of the one or more layers. The one or more layers may include a cobalt-containing material.

Another aspect involves a method including: (a) providing a substrate including one or more metal layers, a free layer, a dielectric barrier layer, and a fixed layer, whereby the dielectric barrier layer is between the free layer and the fixed layer, and the free layer, the dielectric barrier layer, and the fixed layer are between the one or more metal layers, (b) exposing the substrate to a silicon-containing gas and a reducing agent to deposit a silicon-containing material on the substrate, (c) exposing the substrate to a halogen-containing gas for a duration sufficient to substantially saturate the surface of the substrate, and (d) exposing the substrate to an activation gas to etch the substrate.

The method may further include: repeating (b) after substantially all of the free layer is etched and before the dielectric barrier layer is exposed, etching the dielectric barrier layer with a halogen-free chemistry, and repeating (c) and (d) to etch the substrate after the dielectric barrier layer is etched.

Another aspect involves an apparatus for processing a substrate including one or more layers, the apparatus including: (a) one or more process chambers, each process chamber including a chuck; (b) one or more gas inlets into the process chambers and associated flow-control hardware; and (c) a controller having at least one processor and a memory, whereby the at least one processor and the memory are communicatively connected with one another, the at least one processor is at least operatively connected with the flow-control hardware, and the memory stores computer-executable instructions for controlling the at least one processor to at least control the flow-control hardware by: (i) flowing a halogen-containing gas for a duration sufficient to substantially saturate the surface of the substrate; (ii) flowing an activation gas and activating a plasma to etch one or more layers of the substrate; and (iii) providing to the chamber during (i) and (ii) a material reactive with both the halogen-containing gas and a material of the one or more layers on the substrate to form a volatile species, whereby (i)-(iii) are performed without breaking vacuum.

In various embodiments, the instructions for providing the material reactive with both the halogen-containing gas and a material of the one or more layers on the substrate to form a volatile species further include instructions for depositing a material such as silicon-containing material, titanium-containing material, germanium-containing material, tin-containing material, carbon-containing material, and combinations thereof. The halogen-containing gas may be any of $Cl_2$, $BCl_3$, $BBr_3$, $BI_3$, $F_2$, $BF_3$, $Br_2$, $I_2$, and combinations thereof. In some embodiments, the halogen-containing gas is a halide gas. In some embodiments, the memory further includes instructions for repeating (iii) after (i) and (ii) are performed in two or more cycles.

These and other aspects are described further below with reference to the drawings.

BRIEF DESCRIPTION OF THE DRAWINGS

FIGS. 4A-4F are schematic illustrations of an example mechanism for etching substrates in accordance with disclosed embodiments.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

During semiconductor wafer processing, features may be etched through a metal containing layer. In the formation of magnetic random access memories (MRAM), a plurality of thin metal layers or films may be sequentially etched to form magnetic tunnel junction stacks.

A magnetic tunnel junction (MTJ) is composed of a thin dielectric barrier layer between two magnetic materials. Electrons pass through the barrier by the process of quantum tunneling. This can serve as a basis for magnetic-based memory.

Spin-transfer torque is an effect in which the orientation of a magnetic layer in a MTJ can be modified using a spin-polarized current. Charge carriers (e.g., electrons) have a property known as spin, which is a small quantity of angular momentum intrinsic to the carrier. An electrical current is generally unpolarized (50% spin-up and 50% spin-down electrons). By passing a current through a thick magnetic layer (usually called the "fixed layer"), a spin polarized current, with more electrons of either spin can be produced. If this spin-polarized current is directed into a second, thinner magnetic layer (the "free layer"), angular momentum can be transferred to this layer, changing its orientation. This effect can be used to excite oscillations or even flip the orientation of the magnet.

Spin-transfer torque can be used to flip the active elements in magnetic random-access memory. Spin-transfer torque magnetic random-access memory (STT-RAM or STT-MRAM) has the advantages of lower power consumption and better scalability over conventional magnetoresistive random-access memory (MRAM) which uses magnetic fields to flip the active elements. Spin-transfer torque technology has the potential to make possible MRAM devices combining low current requirements and reduced cost. Ralph, D. C.; Stiles, M. D. (April 2008). "Spin transfer torques". Journal of Magnetism and Magnetic Materials 320 (7): 1190-1216.

Figure 1:
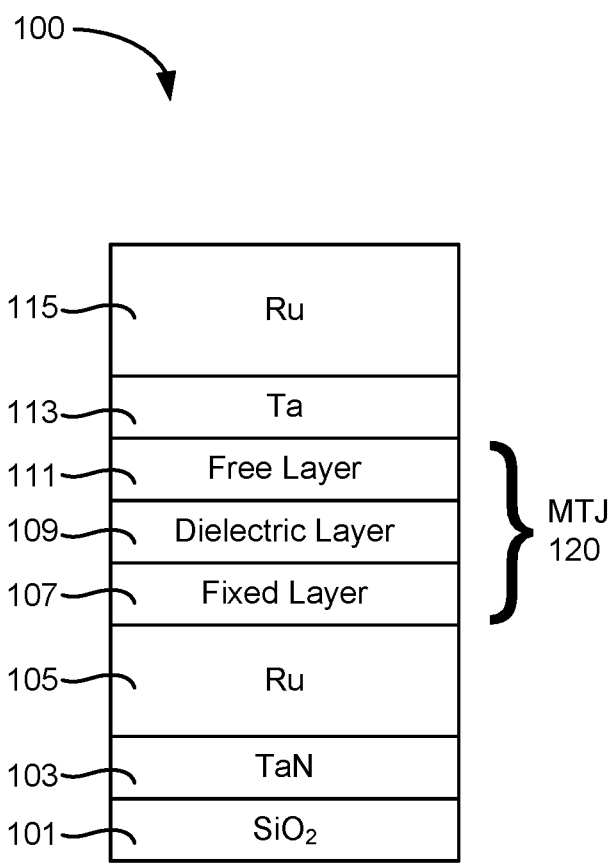
FIG. 1 is a schematic illustration of an example substrate.

An example MTJ stack is provided in FIG. 1. FIG. 1 shows a stack 100 including a silicon oxide etch stop layer 101, a tantalum nitride barrier layer 103, a ruthenium metal layer 105, a fixed layer 107, a dielectric layer 109, a free layer 111, a tantalum layer 113, and another ruthenium metal layer 115. The MTJ stack 120 is composed of the free layer 111, dielectric layer 109, and fixed layer 107 as shown in the Figure. Note that although specific chemistries are shown in the Figure, other suitable chemistries may be present in such a stack. The free layer and fixed layer may include metals and/or metal alloys, such as cobalt iron, or cobalt platinum.

One of the key challenges yet to be overcome in the high density scaling of Spin-Transfer Torque Magneto-Resistive Random-Access Memory (STT MRAM) is in the patterning of the MRAM stack. The MRAM stack contains non-volatile and ferromagnetic materials such as Co, Fe, Mn, Ni, Pt, Pd, Ru which are extremely difficult to pattern without using complicated approaches with ion beam etching (IBE), reactive ion etching (RIE) and wet chemistries. Despite many years of development, current patterning technologies still suffer from many drawbacks such as sidewall re-deposition causing tapered profile and shorting of MTJ to the fixed layer, and corrosion causing MTJ layer damage. In some conventional techniques, a chlorine-containing chemistry is used to etch metal, but the etched byproducts include non-volatile compounds, which may subsequently re-deposit onto sidewalls of the feature.

This disclosure provides a dry plasma etch system to etch non-volatile metals without sidewall re-deposition and damage to exposed layers. For example, disclosed embodiments may be used to etch non-volatile MRAM metals without damaging MTJ layers. Chemistries to form volatile etch products for the MRAM metals, and methods to deliver substantially stoichiometric amounts of reactants for chemical reactions and the precise removal of etch byproducts from the metal etch front are provided. The latter involves an ALD-ALE (atomic layer deposition-atomic layer etch) method that deposits reactants in the solid state and etches the modified surface at a predictable etch rate. To achieve the precise delivery of etch reactants and removal of etch products, a method combining ALD and ALE can be used. In some embodiments, reactants are deposited using other methods, such as plasma enhanced chemical vapor deposition (PECVD).

ALD is a technique that deposits thin layers of material using sequential self-limiting reactions. ALD may be performed using any suitable technique. The concept of an "ALD cycle" is relevant to the discussion of various embodiments herein. Generally an ALD cycle is the minimum set of operations used to perform a surface deposition reaction one time. The result of one cycle is production of at least a partial conformal layer on a substrate surface. Typically, an ALD cycle includes operations to deliver and adsorb at least one reactant to the substrate surface, and then react the adsorbed reactant with one or more reactants to form the partial layer of film. The cycle may include certain ancillary operations such as sweeping one of the reactants or byproducts and/or treating the partial film as deposited. Generally, a cycle contains one instance of a sequence of operations. As an example, an ALD cycle may include the following operations: (i) delivery/adsorption of a precursor to a chamber, (ii) purging of precursor from the chamber, (iii) delivery of a second reactant and a plasma, and (iv) purging of plasma from the chamber.

ALE is a technique that removes thin layers of material using sequential self-limiting reactions. Generally, ALE may be performed using any suitable technique. The concept of an "ALE cycle" is relevant to the discussion of various embodiments herein. Generally an ALE cycle is the minimum set of operations used to perform an etch process one time, such as etching a monolayer. The result of one cycle is that a fixed and predictable amount of a film layer on a substrate surface is etched. Typically, an ALE cycle includes a modification operation to form a modified layer, followed by a removal operation to remove or etch only this modified layer. The cycle may include certain ancillary operations such as sweeping one of the reactants or byproducts. Generally, a cycle contains one instance of a sequence of operations. As an example, an ALE cycle may include the following operations: (i) delivery of a reactant gas to a chamber, (ii) purging of the reactant gas from the chamber, (iii) delivery of a removal gas and an optional plasma, and (iv) purging of the chamber. In some embodiments, etching may be performed nonconformally.

According to disclosed methods, precise etch rate control, damage-free MTJ, as well as conformality and etch uniformity of MRAM features can be realized. As described herein, generally, the volatile etch byproducts can be formed by reacting materials such as Si, with a halogen such as Cl, and metal ions in a substantially stoichiometric manner to form a species such as $M-SiCl_x$ whereby M may be Co, Fe, Mn, Ni, Pt, Pd, or Ru. In some embodiments, with the attachment of the silyl group ($—SiCl_x$) to the metal, the melting/boiling points of the $M-SiCl_x$ species are lowered significantly, and partial pressures are significantly raised, especially in vacuum.

The use of substantially stoichiometric amounts of reactants avoids adverse process impacts. For example, if there is too much Si flux in the plasma, Si deposition may occur, which may prevent a species such as $M-SiCl_x$ from forming in the reaction. Conversely, for example, if there is too little Si, the etch rate is suppressed since the formation of $M-SiCl_x$ species is impeded. Similarly, addition of excess Cl to the metal surface results in the formation of metal chlorides such as $CoCl_2$ or $FeCl_3$ which are non-volatile (having boiling points in excess of 1200° C.).

According to one embodiment, a substantially stoichiometric amount of a material reactive with a halide and/or halogen-containing gas and a metal to form a volatile species is deposited onto the metal (e.g., CoFe) surface by an ALD process in a chamber. Examples include SiN, $SiO_2$, Si, or $TiO_2$. An ALE process activates the deposited Si layer and the metal surface with Cl in the form of $Cl_2$ or $BCl_3$. The excess $Cl_2$ is then pumped out of the chamber. In some embodiments, Ar desorption may be performed, which bombards as well as further activates the chlorinated surfaces to allow the formation of the volatile metal silyl species, which is then pumped out of the chamber. The etch rate reaches a maximum when the Si and Cl reactants are stoichiometrically matched. In some embodiments, the ALE and ALD operations may be conducted without breaking vacuum, including in the same chamber, or in different chamber modules of a tool.

Figure 2:
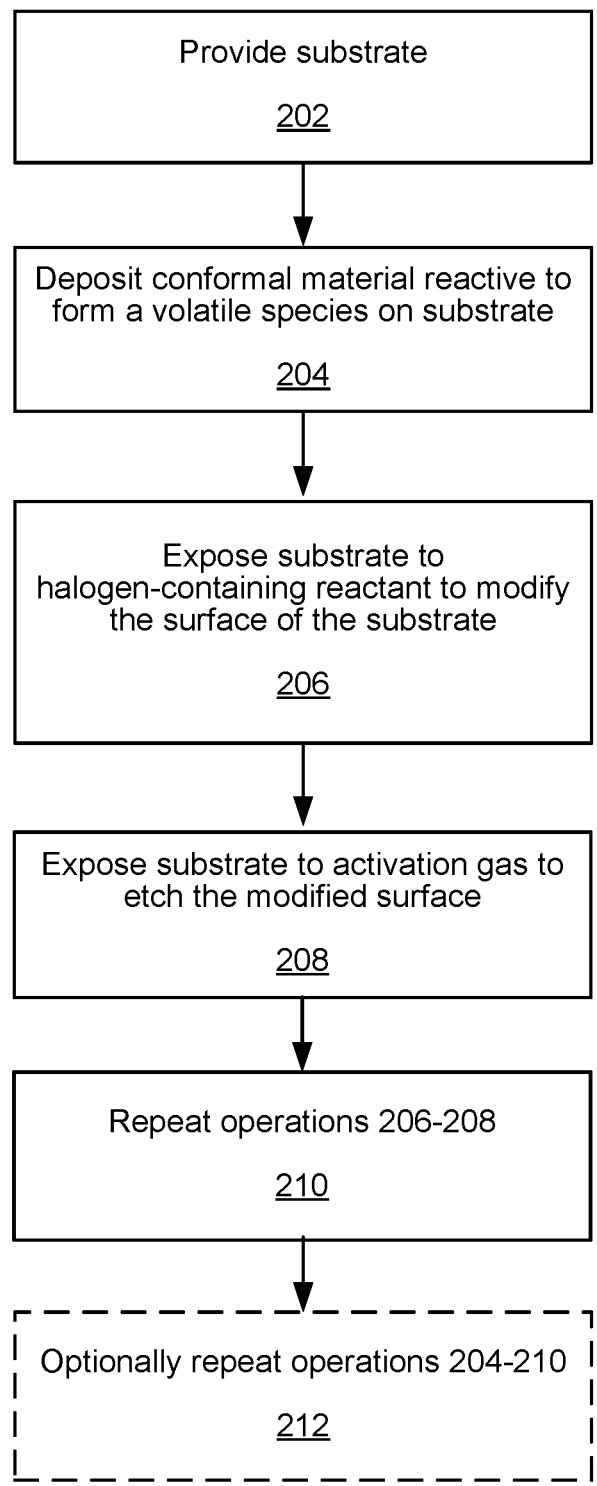
FIG. 2 is a process flow diagram depicting operations of a method performed in accordance with disclosed embodiments.

Disclosed embodiments are now described in further detail with reference to some particular embodiments. FIG. 2 provides a process flow diagram for performing operations in accordance with disclosed embodiments. FIGS. 3A-3G provide schematic illustrations of an example stack etched in accordance with disclosed embodiments. FIGS. 4A-4F provide schematic illustrations of an example mechanism for etching in accordance with disclosed embodiments. Note that although the example provided in FIGS. 4A-4F depict the etching of a metal layer, disclosed embodiments may be used to etch a variety of materials, including semiconducting, conducting, and dielectric material. Further, FIGS. 4A-4F depict an example mechanism, and it should be understood that the scope of the disclosure or claims is not limited by any particular theory of operation. These figures will be discussed together.

Referring to FIG. 2, in operation 202, a substrate is provided. The substrate may be a silicon wafer, e.g., a 200-mm wafer, a 300-mm wafer, or a 450-mm wafer, including wafers having one or more layers of material, such as dielectric, conducting, or semi-conducting material deposited thereon. In various embodiments, the substrate is patterned. A patterned substrate may have "features" such as pillars, poles, trenches, via or contact holes, which may be characterized by one or more of narrow and/or re-entrant openings, constrictions within the feature, and high aspect ratios. The feature(s) may be formed in one or more of the above described layers. One example of a feature is a pillar or pole in a semiconductor substrate or a layer on the substrate. Another example is a trench in a substrate or layer. In various embodiments, the feature may have an under-layer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers.

In some embodiments, the feature(s) such as a pillar may have an aspect ratio of at least about 1:1, at least about 2:1, at least about 4:1, at least about 6:1, at least about 10:1, or higher. The feature(s) may also have a dimension near the opening, e.g., an opening diameter or line width of between about 10 nm to 500 nm, for example between about 25 nm and about 300 nm. Disclosed methods may be performed on substrates with feature(s) having an opening less than about 150 nm. A via, trench or other recessed feature may be referred to as an unfilled feature or a feature. According to various embodiments, the feature profile may narrow gradually and/or include an overhang at the feature opening. A re-entrant profile is one that narrows from the bottom, closed end, or interior of the feature to the feature opening. A re-entrant profile may be generated by asymmetric etching kinetics during patterning and/or the overhang due to non-conformal film step coverage in the previous film deposition, such as deposition of a diffusion barrier. In various examples, the feature may have a width smaller in the opening at the top of the feature than the width of the bottom of the feature.

In some embodiments, the patterned substrate may include a variety of topography across the substrate. In some embodiments, partially fabricated gates may be present on the substrate. In various embodiments, the substrate may include layers of metals, dielectric material, and semiconductor material suitable for etching an MRAM stack in later processing. For example, some substrates may include an MRAM design in which a memory element includes an MTJ. As described elsewhere herein, an MTJ memory element includes two electrodes separated by a thin tunnel barrier. The two electrodes may be ferromagnetic thin film layers, which may be elliptical shaped. In some embodiments, an MTJ memory element includes additional magnetic layers. For example, an MTJ memory element may further include a pair of ferromagnetic layers sandwiching a thin metal layer—these ferromagnetic layers may be referred to as a synthetic antiferromagnet and an antiferromagnetic layer. Further description of shapes and designs of example MRAM memory elements that may be fabricated on substrates using methods described herein is provided in "Cell Shape and Patterning Considerations for Magnetic Random Access Memory (MRAM) Fabrication" by Ditizio, Robert et al., published in "Semiconductor Manufacturing Magazine" pp. 90-96.

Returning to FIG. 2, during operation 202, the substrate may be prepared with a wet etch. For example, in FIG. 3B, a wet etch is performed to etch through the first metal layer 313 on the substrate. In some embodiments, a wet etch is not performed.

Figure 3A:
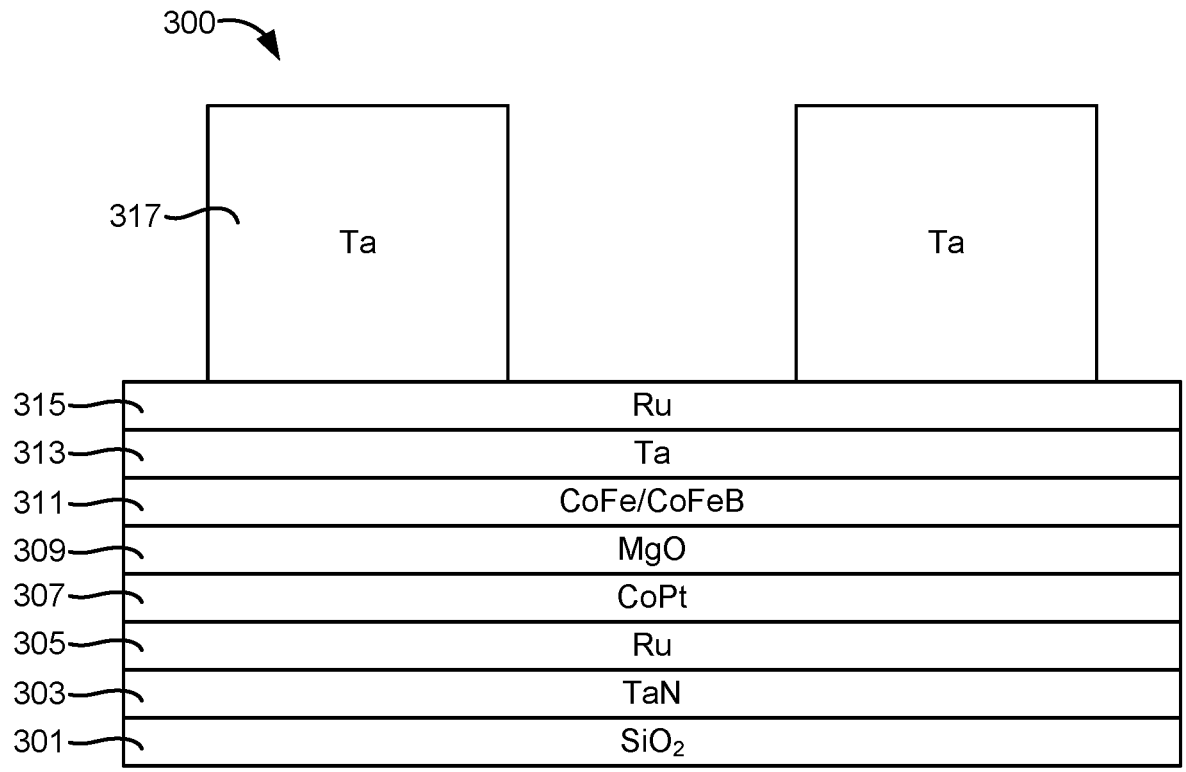
FIGS. 3A-3G are schematic illustrations of an example substrate undergoing operations in accordance with disclosed embodiments.
Figure 3B:
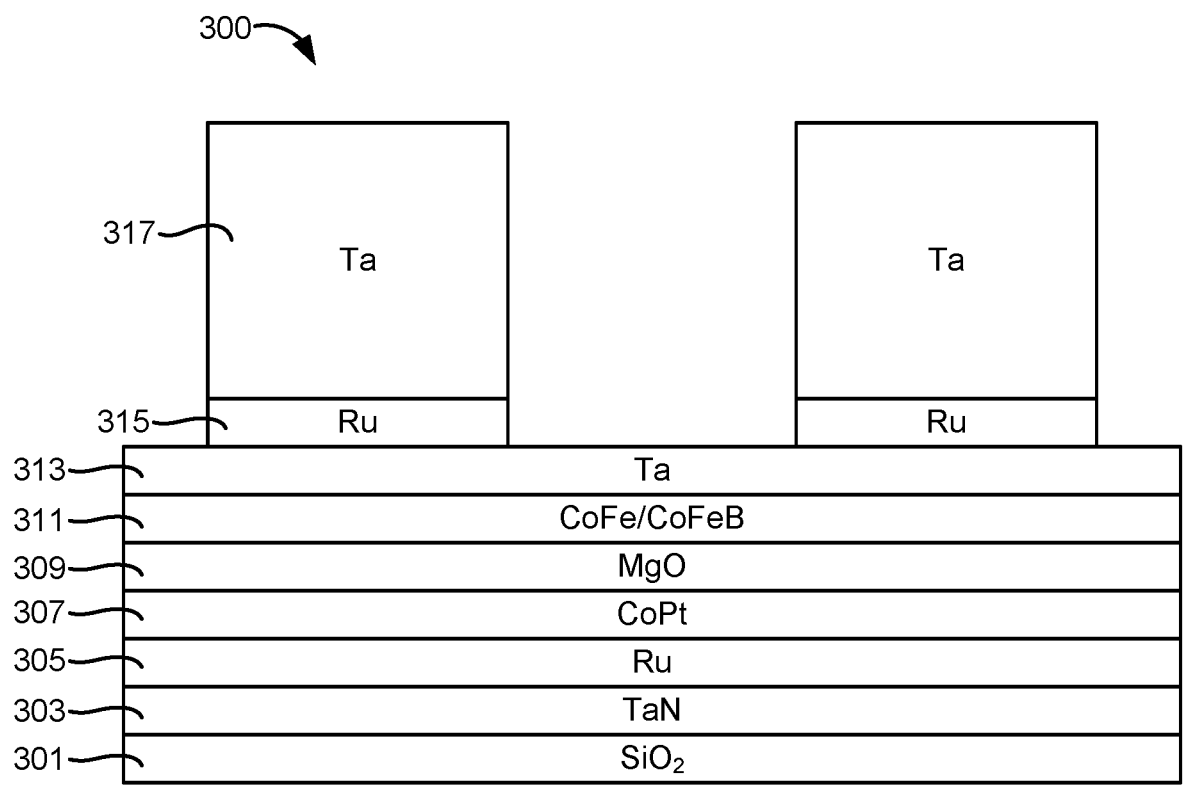

FIG. 3A shows an example of an MRAM stack that may be present on a substrate as described herein. Note that although example chemistries of each stack are labeled on the Figure, any other suitable materials may be present instead of or in combination with the chemistries provided. For example, disclosed embodiments may be used to etch materials for a different pattern (e.g., a non-MRAM pattern). Note that although example layers are depicted in FIGS. 3A-3G, disclosed embodiments may be used to etch other material on the surface while mitigating re-deposition of non-volatile byproducts onto components of the substrate.

Substrate 300 includes an etch stop layer of $SiO_2$ 301. Note that the etch stop layer 301 may be on top of other layers (not shown) in the substrate 300. A thin barrier layer of tantalum nitride (TaN) 303 is on top of the etch stop layer 301 in this stack. On top of the TaN barrier layer 303 is a metal layer including ruthenium (Ru) 305. The metal layer 305 may have a thickness of about 8 nm in some embodiments. On top of the Ru metal layer 305 is a metal or metal alloy layer 307 which may include cobalt platinum (CoPt). In some embodiments, the metal alloy layer 307 may include PtMn. As used herein, layer 307 may be referred to as the "fixed layer" 307. The fixed layer 307 may have a thickness of about 10-30 nm in some embodiments. FIG. 3A also shows a dielectric barrier layer 309 which may include magnesium oxide (MgO). Dielectric barrier layer 309 may be referred to herein as the "dielectric layer" 309. In some embodiments, the dielectric layer 309 may be fairly thin, e.g., having a thickness about 1.5 nm or less.

On top of the dielectric layer 309 is a metal alloy layer 311 which may include cobalt iron (CoFe). The metal alloy layer 311 may include CoFeB. The metal alloy layer 311 may be referred to herein as the "free layer." On top of the free layer 311 is a tantalum (Ta) barrier layer 313. On top of the Ta barrier layer 313 is a Ru metal layer 315. In embodiments disclosed herein, Ru metal layer 315 may be referred to as the "first metal layer," while the Ru metal layer 305 may be referred to as the "second metal layer." A Ta hard mask 317 may be deposited and etched into a pattern such as shown in FIG. 3A. Note the hard mask 317 may not necessarily be a tantalum hard mask. For example, other suitable hard masks include carbon-containing hard masks, nitrogen-containing hard masks, and oxygen-containing hard masks.

Returning to FIG. 2, in operation 204, a material is conformally deposited on the substrate. The material is reactive with a halide and/or halogen-containing gas and material of the layers on the substrate to form a volatile species. In some embodiments, the material is reactive with one or more halide and/or halogen-containing gases and one or more materials of the layers on the substrate to form a volatile species. For example, the material may react with a cobalt-containing metal and a mixture of $BCl_3$ and $Cl_2$ to form a volatile species. The material provides both a source of material to form a volatile species as well as a protective layer on the substrate. For purposes of the following description, this conformal material may be referred to as "a protective layer" but it will be understood that the protective layer includes material that reacts with a halide and/or halogen-containing gas and a material on the substrate to form a volatile species and may be conformal.

The protective layer deposited in operation 202 includes an element capable of forming a volatile species with a metal halide. The protective layer may include any Group IV element. For example, the protective layer may be a silicon-containing layer, a titanium-containing layer, germanium-containing layer, a tin-containing layer, a carbon-containing layer, or any combination thereof. Example silicon-containing layers include silicon oxide, silicon nitride, amorphous silicon, poly-silicon, and mixtures thereof. Example titanium-containing layers include titanium oxide, titanium nitride, titanium, and mixtures thereof. In some embodiments, the protective layer is a dielectric material.

The protective layer may be deposited by any suitable method, including chemical vapor deposition (CVD), plasma enhanced CVD (PECVD), atomic layer deposition (ALD), plasma enhanced ALD, (PEALD), spin-on deposition, and sputtering. In some embodiments the protective layer provides a source of a material for reacting with a halide and/or halogen and a metal-containing compound to form a volatile species. For example, a Si source may be introduced onto the MRAM surfaces for reaction by methods other than ALD, such as PVD, PECVD or spin-coating processes using gases such as $SiH_4$, $SiCl_4$ or using liquids such ortho-silicate compounds e.g. TEOS, SOG and HMDS.

For example, the protective layer may be deposited by PECVD. An example includes exposing the substrate to a silicon-containing precursor and a nitrogen-containing reactant simultaneously with a plasma. For example, the substrate may be exposed to silane and nitrogen plasma simultaneously. Any suitable precursors and reactants capable of depositing the protective layer having any of the above chemistries may be used to deposit the protective layer.

Figure 3C:
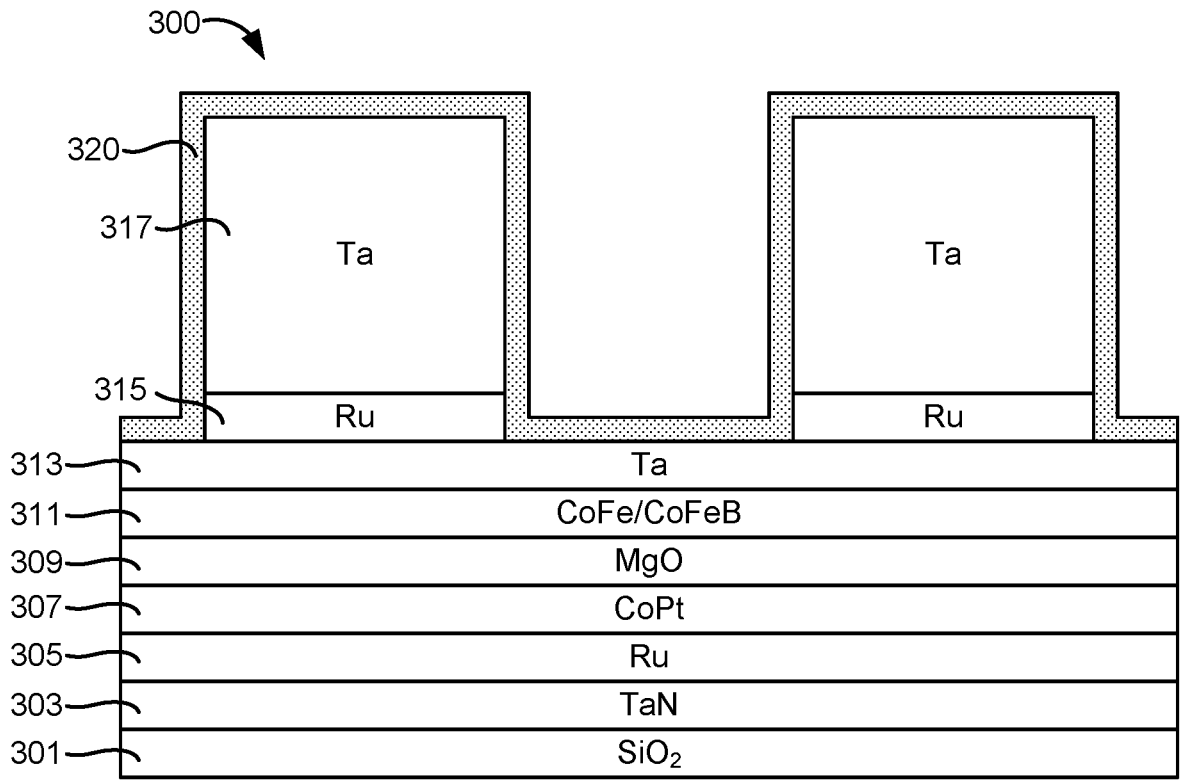

In FIG. 3C, a protective layer 320 is shown as being deposited on substrate 300. In some embodiments this may be a first protective layer (e.g., in some operations another protective layer 320 may also be deposited). Note that in the depiction, the protective layer 320 is conformal. In some embodiments, the protective layer 320 need not be conformal. In some embodiments, portions of the protective layer 320 may be a sacrificial layer.

FIG. 4A is another example of a schematic illustration of a portion of a substrate 400. In this example, the substrate 400 includes a metal layer 411, which may include, for example, Co, Fe, Mn, Pd, Pt, alloys thereof, and combinations thereof. Here, the Ru first metal layer has been wet etched, and a silicon-containing protective layer 420 (e.g., Si source) has been deposited over the tantalum hard mask and the metal layer 411. Note that although similar to FIG. 3C, the substrate in FIG. 4A excludes the tantalum barrier layer for purposes of illustration. Although specific examples of layers are depicted in FIG. 4A, any suitable metal may be underlying the hard mask, and any composition of a hard mask may be present. Further, any suitable protective layer 420 may be used in disclosed embodiments and such protective layers are not limited to silicon-containing layers such as shown in FIG. 4A.

Returning to FIG. 2, during operation 206, the substrate is exposed to a halogen-containing reactant to modify a surface of the substrate. The halogen-containing reactant may include a boron halogen-containing gas, a halogen-containing gas, a halide gas, and combinations thereof. Examples include $BCl_3$, $BBr_3$, $BI_3$, $Cl_2$, $F_2$, $Br_2$, and $I_2$. One example of a combination of gases may be $BCl_3/Cl_2$. The halogen-containing reactant may react with and/or adsorb onto the protective layer. For example, a protective layer of silicon may react with the halogen-containing reactant to form a silicon halide on the surface of the substrate. Note in some embodiments, the halogen-containing reactant may saturate at least about 90% of the substrate, or at least about 99% of the substrate. In some embodiments, the halogen-containing reactant may adsorb conformally onto the surface of the substrate. In one example, chlorine atoms and/or molecules may adsorb onto the surface of a silicon-containing protective layer.

FIG. 4B shows an example schematic depiction of chlorine molecules 450a from $Cl_2$ reacting with the protective layer 420 and adsorbing to the surface of the protective layer 420 to form an adsorbed layer 450b on the surface. An example substrate 400 in FIG. 4B shows arrows depicting the direction the $Cl_2$ molecules 450a are moving toward the surface of the substrate 400 to adsorb onto or react to the surface of the substrate 400. A bias may be supplied at a power less than about 100 Vb, or less than about 60 Vb, for example about 50 Vb.

In operation 208 of FIG. 2, the substrate is exposed to an activation gas to etch the modified surface of the substrate. In various embodiments, the activation gas may include one or more inert gases, such as argon, carbon dioxide, ammonia, hydrogen-containing gas, and combinations thereof. During operation 208, an activation source such as plasma is generated to activate the gas and etch the substrate. During operation 208 of FIG. 2, surfaces with adsorbed halogen-containing compounds that are also perpendicular to the direction of the bias etch may be etched completely. In some embodiments, a low bias may be applied to directionally etch the substrate. For example, the bias may be supplied at a power less than about 100 Vb, for example about 50 Vb. The power of the plasma may be between about 500 W and about 1500 W.

In FIG. 4C, the etched compounds including silicon chloride 470 are removed from the horizontal surface of the field region of the tantalum hard mask, and while the deposited conformal or protective layer 420 is removed to reveal an exposed metal layer 411. Note that, as shown in FIG. 4C, some of the protective layer deposited on the sidewalls of the hard mask and first metal layer (here, Ta and Ru respectively) remains on the sidewall. This remaining protective layer may serve as a layer to continuously protect the hard mask from being damaged or degraded by any potential byproducts from the etching reaction.

Figure 3D:
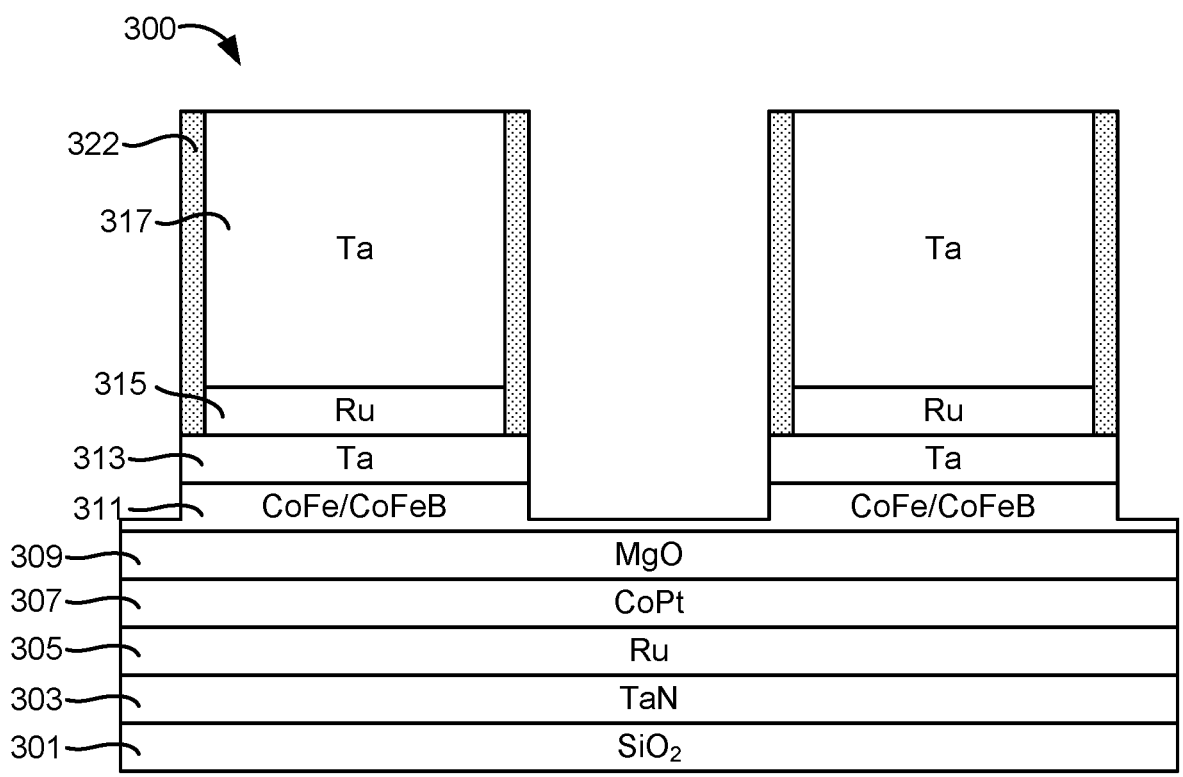

As a result, the substrate in FIG. 3C after performing operations 206 and 208 may have the structure depicted in FIG. 3D. A directional etch may be performed such that some protective layer 322 as shown in FIG. 3D remains on the sidewalls of the feature, while one or more layers below (for example, tantalum barrier layer 313 and most of CoFe free layer 311) are etched. Note that in various embodiments CoFe free layer 311 is not completely etched to prevent the dielectric layer 309 from being etched easily and etching into the sides of the feature. For example, where a substrate includes a dielectric layer 309 including MgO adjacent to a free layer 311, the free layer 311 may be etched such that between about 0 Å and about 10 Å remains on the substrate. Note that in various embodiments, the substrate is etched through these layers by performing various operations in cycles.

For example, as shown in FIG. 2, in operation 210, operations 206-208 may be optionally repeated. In some embodiments, repeating 206 and 208 may constitute a cycle. For example, in some embodiments, operations 206 and 208 may be repeated for two or more cycles. Each cycle may be performed to etch between about 1 Å and about 10 Å per cycle, such as about 6 Å per cycle. Thus, in some embodiments, the substrate shown in FIG. 3C may be etched using cycles of operation 206 and 208 to etch through the surfaces of the substrate perpendicular to the direction of a directional etch implemented by applying a bias. For example, as shown in FIG. 3C, operations 206 and 208 may be repeated to etch through conformal or protective layer 320, tantalum barrier layer 313, and most of CoFe/CoFeB free layer 311. As described above, cycles of operations 206 and 208 may be stopped prior to completely etching CoFe/CoFeB free layer 311 to protect the MgO dielectric layer 309 or may continue to completely etch through the MgO dielectric layer 309.

Figure 3E:
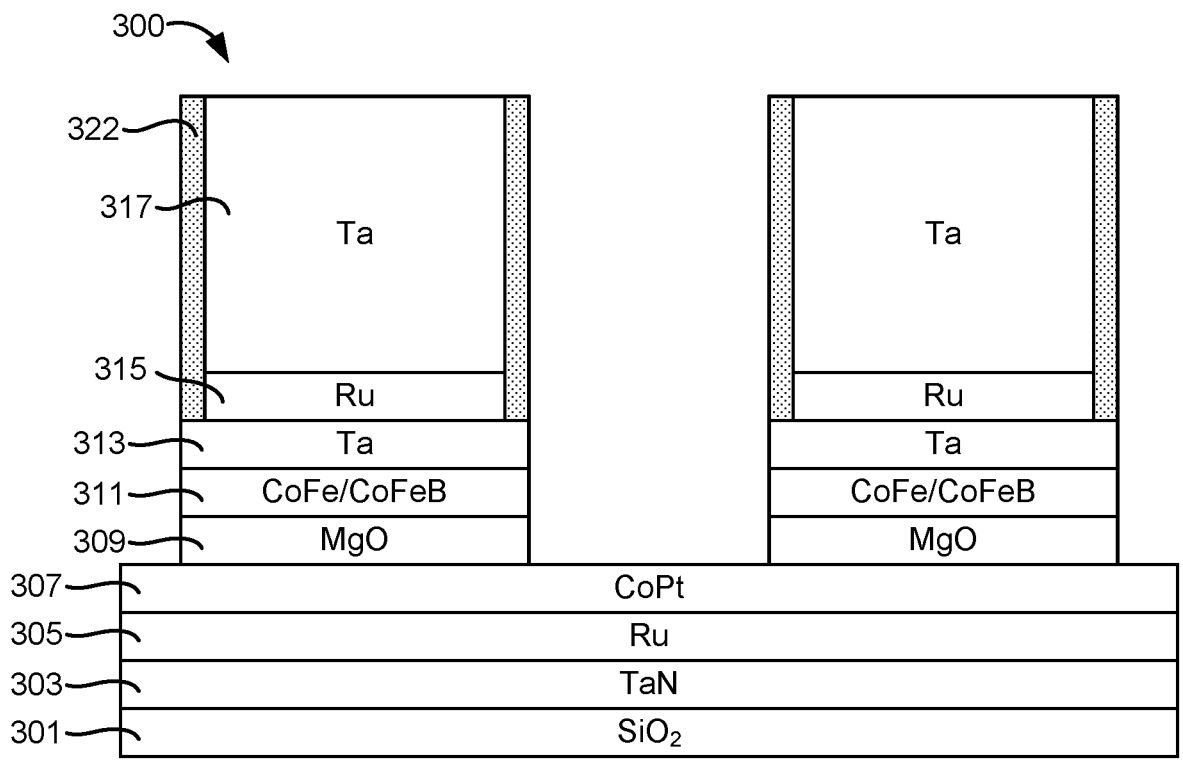

In FIG. 3E, operation 208 may be performed without exposing the substrate to a halogen-containing gas to etch through the thin layer of the CoFe/CoFeB free layer 311 and etch the MgO dielectric layer 309. In some embodiments, operation 208 is performed by exposing the substrate to a halogen-free gas. In various embodiments, argon gas is sputtered using a bias to etch the dielectric layer so as not to perform a harsh etch chemistry over the dielectric layer. In some embodiments, a harsh etch chemistry applied to the dielectric layer may cause the dielectric layer to be etched below the mask, thereby causing potential degradation and device failure issues. In some embodiments, during the dielectric etch, a bias is applied. For example, the bias may be supplied at a power less than about 100 Vb, for example about 50 Vb.

Figure 4E:
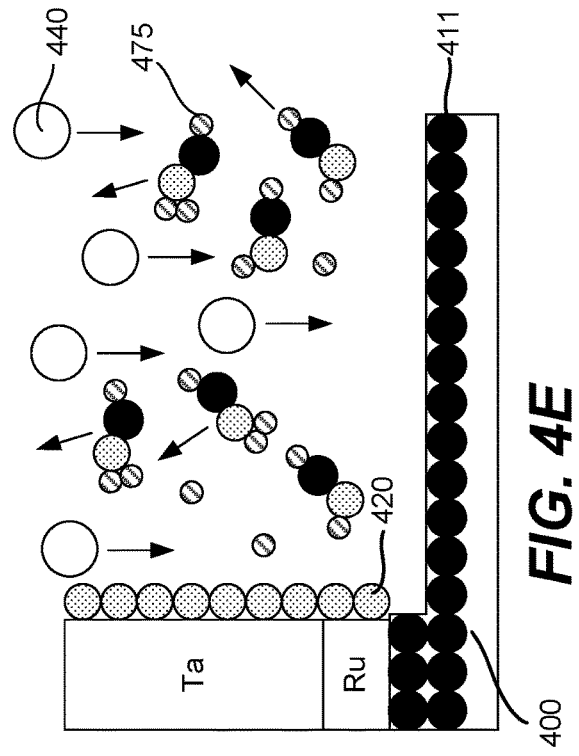
Figure 4D:
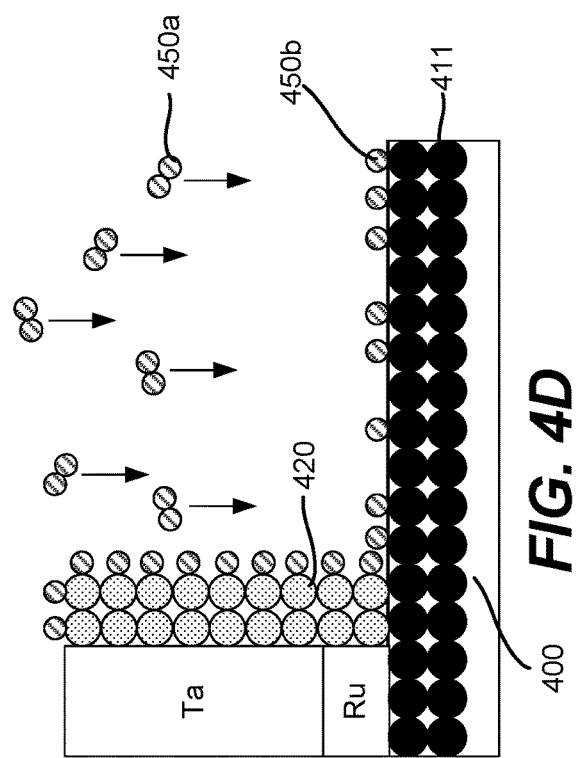
Figure 4F:
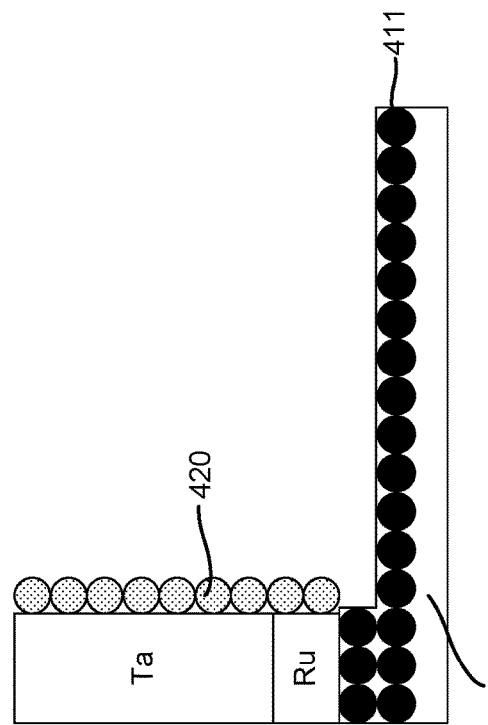

FIGS. 4D-4F show schematic illustrations of an example etch mechanism continuing from FIG. 4C such that operations 206 and 208 of FIG. 2 are repeated in operation 210. FIG. 4D shows a substrate 400 whereby operation 206 is repeated. After the metal layer 411 is exposed in FIG. 4C, the substrate is exposed to $Cl_2$ 450 a in FIG. 4D to modify the surface of the substrate. As shown, $Cl_2$ may adsorb onto the surface of the substrate 400 or may react with the surface of the substrate to form an adsorbed layer of chlorine 450b. Note that since the protective layer 420 remains on the sidewall from prior deposition of a silicon-containing material, some chlorine 450b may adsorb onto or react with the protective layer 420, while some chlorine 450b may adsorb onto or react with the metal surface 411.

FIG. 4E shows a substrate whereby operation 208 is repeated. As shown, argon (e.g., an activation gas) 440 is introduced to the substrate and a plasma is ignited to etch the substrate. In various embodiments, a bias is applied to directionally etch the substrate, as indicated by the arrows in FIG. 4E. The presence of the silicon-containing protective layer 420 forms a complex 475 with the adsorbed chlorine 450b and metal from the metal surface 411. Note that not all complexes 475 may have the same chemical structure. However, the protective layer 420 provides, in this example, silicon to form a volatile species 475 that can be purged from a chamber where the substrate is processed. In various embodiments, the protective layer 420 may additionally or alternatively include other material, such as titanium, germanium, and other material reactive with a metal and a halide and/or halogen gas to form a volatile species.

In some embodiments, during the Si-assisted ALE etch, a $SiO_2/SiN$ protective layer (such as protective layer 420 in FIG. 4A) is deposited onto the MRAM metal surface. The Si doped metal surface (as shown in FIG. 4B) is then activated with $BCl_3/Cl_2$ gases (such as chlorine molecules 450a) to form an adsorbed layer of chlorine (450b). A directional Ar ion beam of Ar gas (440) bombards the modified layer and in the process breaks and allows formation of new bonds to form, and finally desorbs the volatile etch products (M-Si-$Cl_x$) (475) into the gas phase.

In summary, an example activation reaction may be as follows:

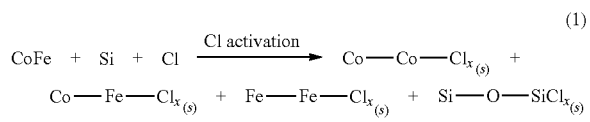

(1)

An example desorption/recombination reaction may be as follows:

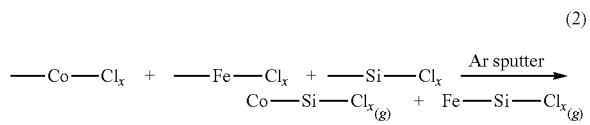

(2)

The M-$SiCl_x$ complexes are stable and volatile, and can survive Ar sputter desorption without disintegration into the metal forms. As a result, re-deposition on the sidewall is reduced or avoided.

Disclosed embodiments involve depositing a material reactive with a halide and/or halogen-containing gas and a metal to form a volatile species. Examples include silicon-containing material, titanium-containing material, germanium-containing material, tin-containing material, carbon-containing material, and combinations thereof. In some embodiments, the material deposited may be a silicon-containing material such as amorphous silicon, poly silicon, silicon oxide, or silicon nitride. In some embodiments, the material deposited may be titanium or titanium oxide.

Disclosed embodiments are also suitable for etching the fixed layer; CoPt, CoPd, PtMn and a variety of other materials, including Co, Fe, Mn, Pt, Ru, and Ta. The principles are applicable to all other transition metals in the 1st, 2nd and 3rd rows (e.g., Periods IV, V, and VI transition metals), including metals such as Cu. Other stable gaseous complex species, such as in the same Group IV, for example Ge and Sn, can exhibit the same behavior.

Besides Si, similar volatile etch products can also be formed with other members of the Group IV in the periodic table such as C, Ge, Sn to form stable and volatile species such as M-$CCl_x$, M-GeClX, and M-SnClX in the plasma. These reactants can be introduced as halides gases such CClX, SiClX, GeClX and SnClX (where X is a halogen, e.g., F, Cl or Br with various stoichiometry) or other sources that allow the deposition of these elements onto the MRAM metal surface.

The activation, formation and desorption of the volatile metal etch products may be conducted by methods other than ALE; methods such as reactive ion etching (RIE), electron cyclotron resonance etch (ECR), or thermal desorption and UV processes may also be used in some embodiments. Disclosed embodiments may also be integrated with wet etching and/or reactive ion etching processes.

FIG. 4F shows the substrate after a layer of the metal surface 411 has been etched. Note that some of the protective layer 420 may be etched when operations 206 and 208 are performed in various cycles.

Accordingly, in operation 212 of FIG. 2, operations 204-210 may be optionally repeated such that operation 204 forms a first conformal material and a repeated operation of operation 204 forms a second conformal material which is deposited on the substrate to provide further material reactive with a halide and/or halogen-containing gas and a metal on the substrate to form a volatile species.

Figure 3F:
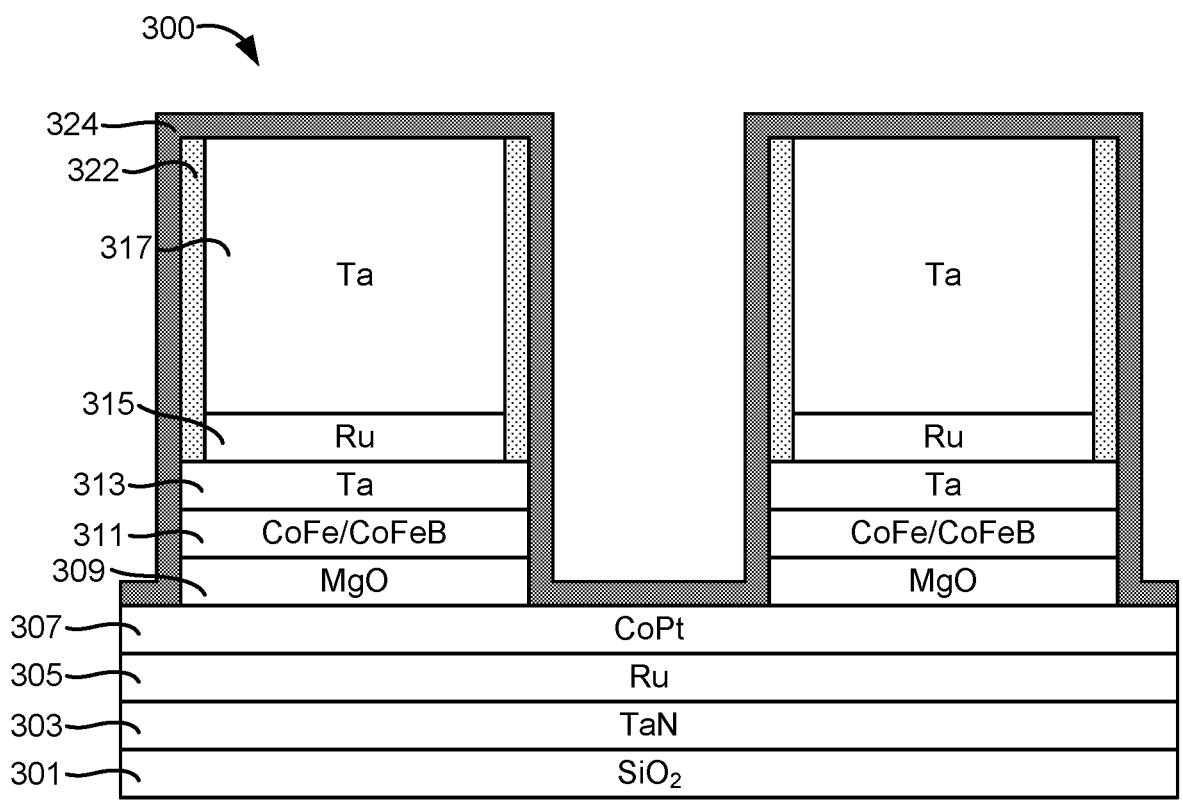

FIG. 3F shows an example of a substrate corresponding to operation 212. As shown, operation 204 has been repeated to further deposit a second protective layer 324 over the substrate. This protective layer 324 may serve to further protect the Ta barrier layer 313, the CoFe free layer 311, and the etched MgO dielectric layer 309.

Figure 3G:
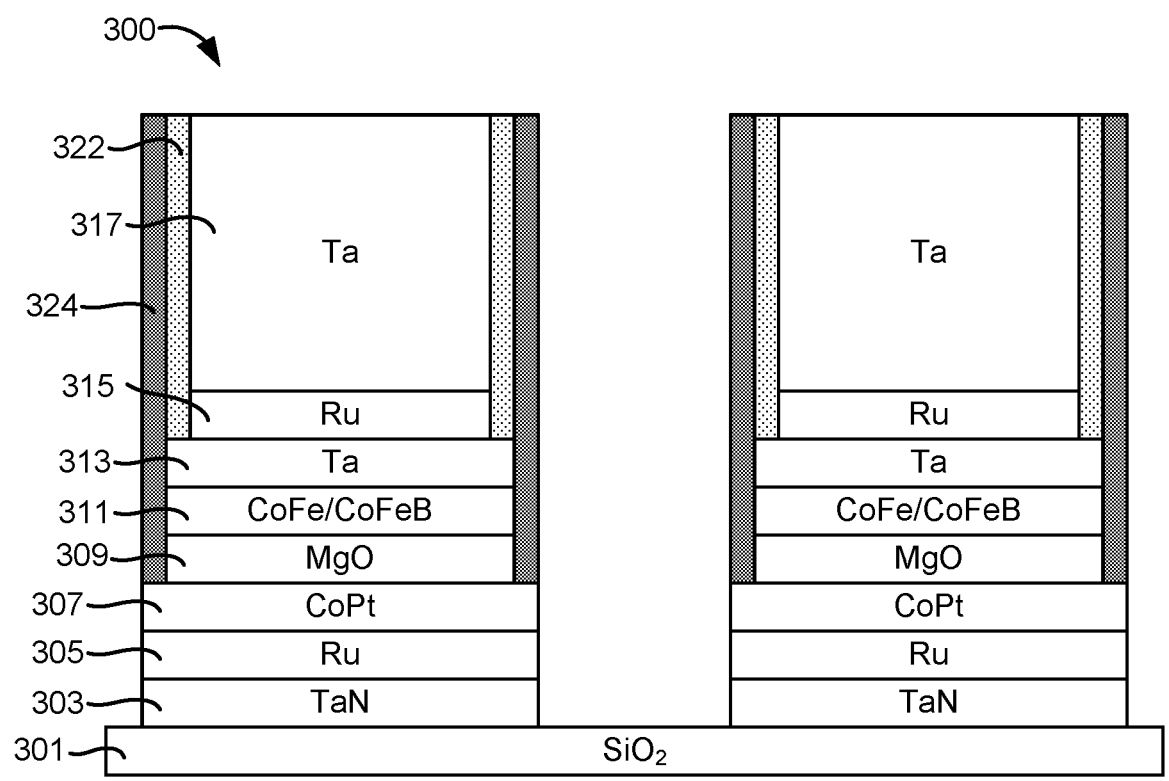

Accordingly, operations 206 and 208 may be repeated, also in cycles, until the rest of the substrate is etched to the etch stop layer. FIG. 3G shows the etched substrate whereby operations 206 and 208 have been repeated in cycles to etch through the CoPt fixed layer 307, the second Ru metal layer 305, and the TaN barrier layer 303. Note the substrate 300 shows the remaining protective layers 322 and 324 on the sidewalls. In various embodiments, these layers may be reduced or removed after the stack is fabricated. In some embodiments, some or part of these layers may also be etched when disclosed embodiments are performed.

While the disclosure is in no way limited by theory, it is believed that the deposition-etch mechanism for MRAM metals (e.g., Co, Fe, Mn, Pd, and Pt) can proceed as follows. The mechanism involves dry chemical etching of these metals without re-deposition of the metals on sidewalls through the introduction of Si during Cl (for example provided by $BCl_3$ and/or $Cl_2$) and Ar ALE. As described above, without being bound by any particular theory, it is believed that the presence of Si or other material reactive with a halide and/or halogen-containing gas and a metal results in the formation of volatile etch products such as Co—$SiCl_x$ or Fe—$SiCl_x$, which have high partial pressures in the etch chamber and can be easily pumped away.

Apparatus

Inductively coupled plasma (ICP) reactors which, in certain embodiments, may be suitable for atomic layer etching (ALE) operations and atomic layer deposition (ALD) operations are now described. Such ICP reactors have also been described in U.S. Patent Application Publication No. 2014/0170853, filed Dec. 10, 2013, and titled "IMAGE REVERSAL WITH AHM GAP FILL FOR MULTIPLE PATTERNING," hereby incorporated by reference in its entirety and for all purposes. Although ICP reactors are described herein, in some embodiments, it should be understood that capacitively coupled plasma reactors may also be used.

Figure 5:
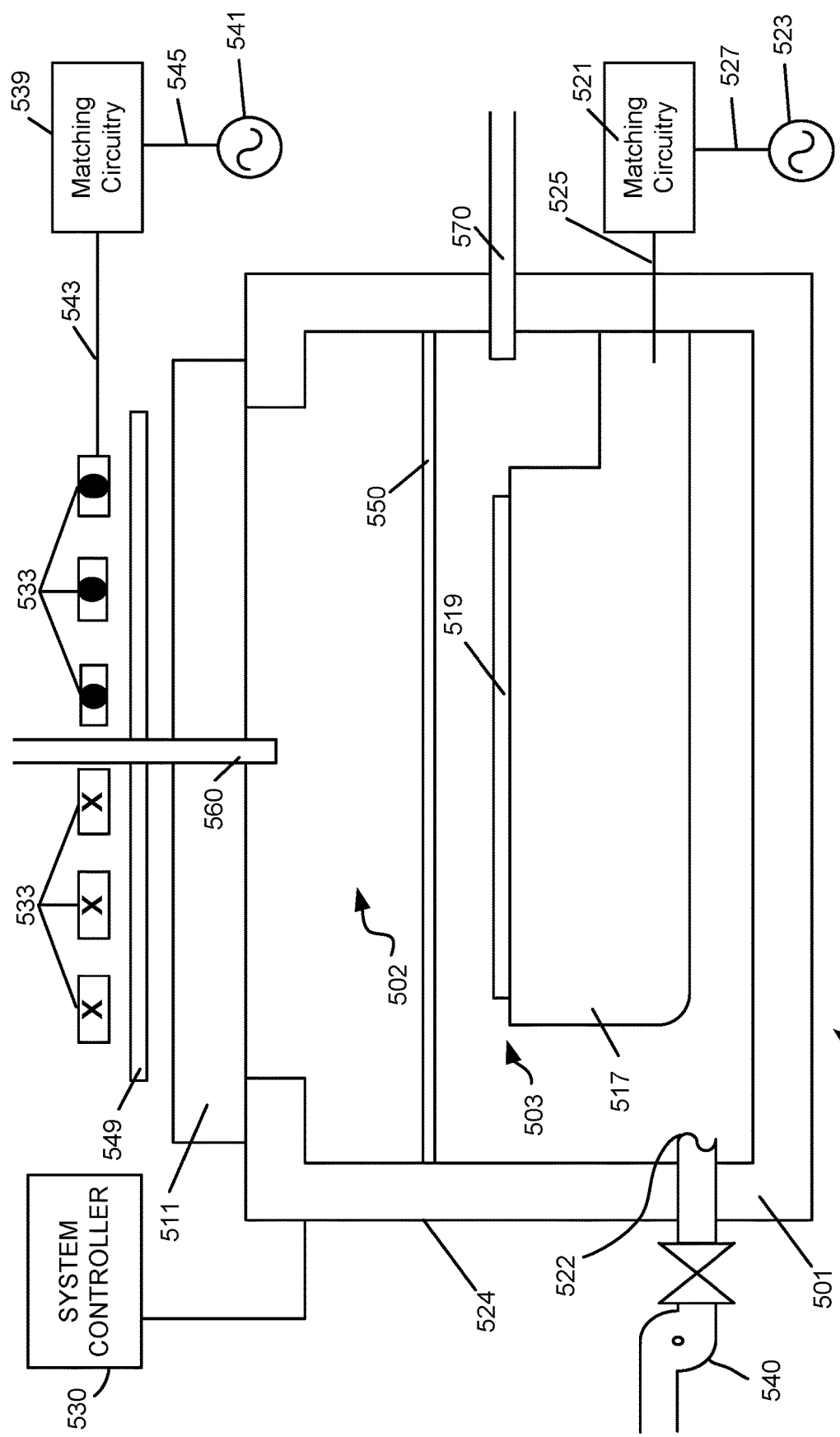
FIG. 5 is a schematic diagram of an example process chamber for performing disclosed embodiments.

FIG. 5 schematically shows a cross-sectional view of an inductively coupled plasma integrated etching and deposition apparatus 500 appropriate for implementing certain embodiments herein, an example of which is a Kiyo® reactor, produced by Lam Research Corp. of Fremont, Calif. The inductively coupled plasma apparatus 500 includes an overall process chamber 524 structurally defined by chamber walls 501 and a window 511. The chamber walls 501 may be fabricated from stainless steel or aluminum. The window 511 may be fabricated from quartz or other dielectric material. An optional internal plasma grid 550 divides the overall process chamber into an upper sub-chamber 502 and a lower sub-chamber 503. In most embodiments, plasma grid 550 may be removed, thereby utilizing a chamber space made of sub-chambers 502 and 503. A chuck 517 is positioned within the lower sub-chamber 503 near the bottom inner surface. The chuck 517 is configured to receive and hold a semiconductor substrate or wafer 519 upon which the etching and deposition processes are performed. The chuck 517 can be an electrostatic chuck for supporting the wafer 519 when present. In some embodiments, an edge ring (not shown) surrounds chuck 517, and has an upper surface that is approximately planar with a top surface of the wafer 519, when present over chuck 517. The chuck 517 also includes electrostatic electrodes for chucking and dechucking the wafer 519. A filter and DC clamp power supply (not shown) may be provided for this purpose. Other control systems for lifting the wafer 519 off the chuck 517 can also be provided. The chuck 517 can be electrically charged using an RF power supply 523. The RF power supply 523 is connected to matching circuitry 521 through a connection 527. The matching circuitry 521 is connected to the chuck 517 through a connection 525. In this manner, the RF power supply 523 is connected to the chuck 517.

Elements for plasma generation include a coil 533 is positioned above window 511. In some embodiments, a coil is not used in disclosed embodiments. The coil 533 is fabricated from an electrically conductive material and includes at least one complete turn. The example of a coil 533 shown in FIG. 5 includes three turns. The cross-sections of coil 533 are shown with symbols, and coils having an "X" extend rotationally into the page, while coils having a "•" extend rotationally out of the page. Elements for plasma generation also include an RF power supply 541 configured to supply RF power to the coil 533. In general, the RF power supply 541 is connected to matching circuitry 539 through a connection 545. The matching circuitry 539 is connected to the coil 533 through a connection 543. In this manner, the RF power supply 541 is connected to the coil 533. An optional Faraday shield 549 is positioned between the coil 533 and the window 511. The Faraday shield 549 is maintained in a spaced apart relationship relative to the coil 533. The Faraday shield 549 is disposed immediately above the window 511. The coil 533, the Faraday shield 549, and the window 511 are each configured to be substantially parallel to one another. The Faraday shield 549 may prevent metal or other species from depositing on the window 511 of the process chamber 524.

Process gases (e.g. halide gases, halogen-containing gases, chlorine, argon, silicon tetrachloride, oxygen, nitrogen, etc.) may be flowed into the process chamber through one or more main gas flow inlets 560 positioned in the upper sub-chamber 502 and/or through one or more side gas flow inlets 570. Likewise, though not explicitly shown, similar gas flow inlets may be used to supply process gases to a capacitively coupled plasma processing chamber. A vacuum pump, e.g., a one or two stage mechanical dry pump and/or turbomolecular pump 540, may be used to draw process gases out of the process chamber 524 and to maintain a pressure within the process chamber 524. For example, the vacuum pump may be used to evacuate the lower sub-chamber 503 during a purge operation of ALD. A valve-controlled conduit may be used to fluidically connect the vacuum pump to the process chamber 524 so as to selectively control application of the vacuum environment provided by the vacuum pump. This may be done employing a closed-loop-controlled flow restriction device, such as a throttle valve (not shown) or a pendulum valve (not shown), during operational plasma processing. Likewise, a vacuum pump and valve controlled fluidic connection to the capacitively coupled plasma processing chamber may also be employed.

During operation of the apparatus 500, one or more process gases may be supplied through the gas flow inlets 560 and/or 570. In certain embodiments, process gas may be supplied only through the main gas flow inlet 560, or only through the side gas flow inlet 570. In some cases, the gas flow inlets shown in the figure may be replaced by more complex gas flow inlets, one or more showerheads, for example. The Faraday shield 549 and/or optional grid 550 may include internal channels and holes that allow delivery of process gases to the process chamber 524. Either or both of Faraday shield 549 and optional grid 550 may serve as a showerhead for delivery of process gases. In some embodiments, a liquid vaporization and delivery system may be situated upstream of the process chamber 524, such that once a liquid reactant or precursor is vaporized, the vaporized reactant or precursor is introduced into the process chamber 524 via a gas flow inlet 560 and/or 570.

Radio frequency power is supplied from the RF power supply 541 to the coil 533 to cause an RF current to flow through the coil 533. The RF current flowing through the coil 533 generates an electromagnetic field about the coil 533. The electromagnetic field generates an inductive current within the upper sub-chamber 502. The physical and chemical interactions of various generated ions and radicals with the wafer 519 etch features of and deposit layers on the wafer 519.

If the plasma grid 550 is used such that there is both an upper sub-chamber 502 and a lower sub-chamber 503, the inductive current acts on the gas present in the upper sub-chamber 502 to generate an electron-ion plasma in the upper sub-chamber 502. The optional internal plasma grid 550 limits the amount of hot electrons in the lower sub-chamber 503. In some embodiments, the apparatus 500 is designed and operated such that the plasma present in the lower sub-chamber 503 is an ion-ion plasma.

Both the upper electron-ion plasma and the lower ion-ion plasma may contain positive and negative ions, though the ion-ion plasma will have a greater ratio of negative ions to positive ions. Volatile etching and/or deposition byproducts may be removed from the lower sub-chamber 503 through port 522. The chuck 517 disclosed herein may operate at elevated temperatures ranging between about 10° C. and about 250° C. The temperature will depend on the process operation and specific recipe.

Apparatus 500 may be coupled to facilities (not shown) when installed in a clean room or a fabrication facility. Facilities include plumbing that provide processing gases, vacuum, temperature control, and environmental particle control. These facilities are coupled to apparatus 500, when installed in the target fabrication facility. Additionally, apparatus 500 may be coupled to a transfer chamber that allows robotics to transfer semiconductor wafers into and out of apparatus 500 using typical automation.

In some embodiments, a system controller 530 (which may include one or more physical or logical controllers) controls some or all of the operations of a process chamber 524. The system controller 530 may include one or more memory devices and one or more processors. In some embodiments, the apparatus 500 includes a switching system for controlling flow rates and durations when disclosed embodiments are performed. In some embodiments, the apparatus 500 may have a switching time of up to about 500 ms, or up to about 750 ms. Switching time may depend on the flow chemistry, recipe chosen, reactor architecture, and other factors.

In some implementations, the system controller 530 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be integrated into the system controller 530, which may control various components or subparts of the system or systems. The system controller 530, depending on the processing parameters and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 530 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication or removal of one or more layers, materials, metals, oxides, silicon, silicon dioxide, surfaces, circuits, and/or dies of a wafer.

The system controller 530, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 530 receives instructions in the form of data, which specify parameters for each of the processing steps to be performed during one or more operations. It should be understood that the parameters may be specific to the type of process to be performed and the type of tool that the controller is configured to interface with or control. Thus as described above, the system controller 530 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an ALE chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Figure 6:
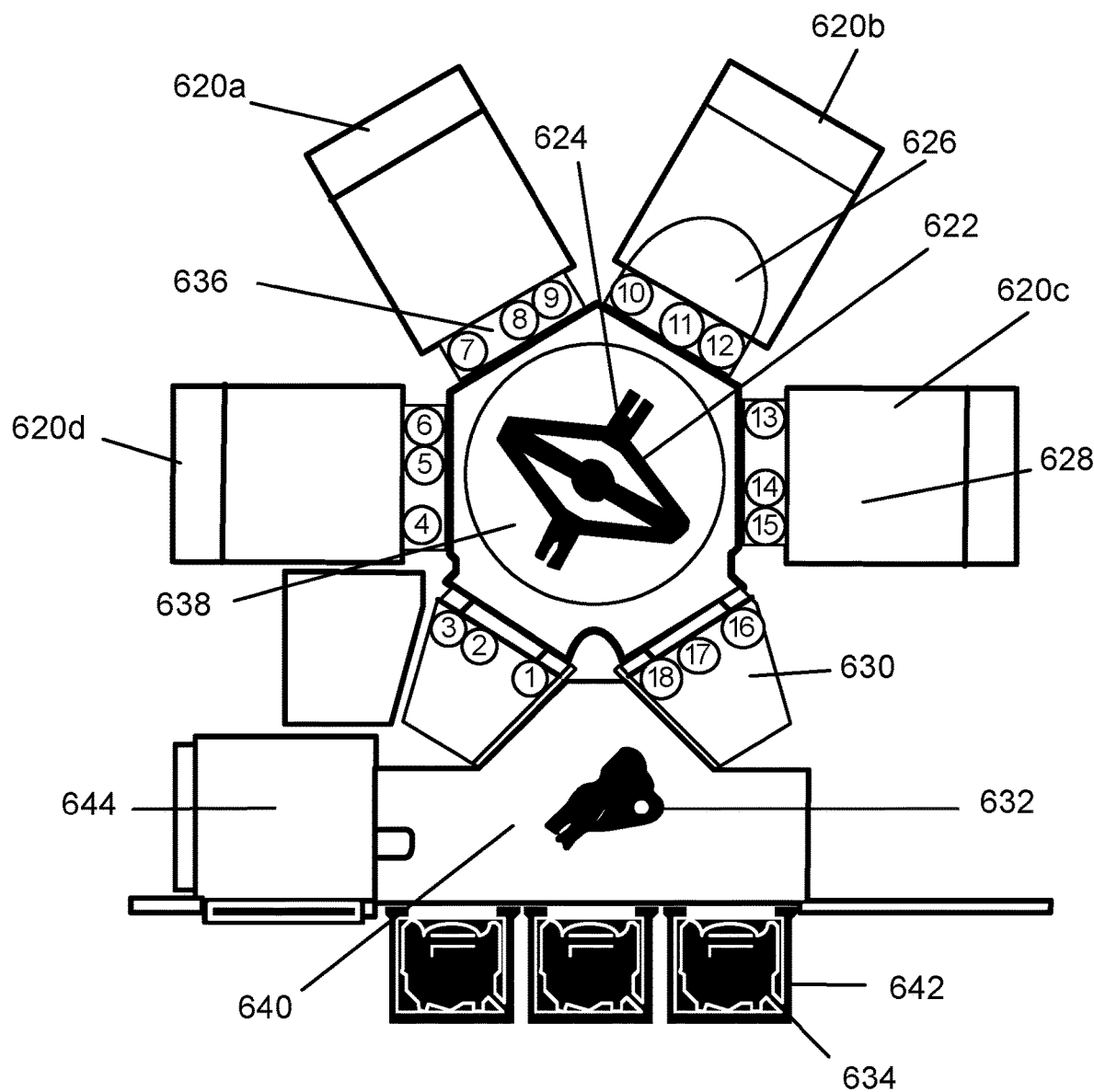
FIG. 6 is a schematic diagram of an example process apparatus for performing disclosed embodiments.

FIG. 6 depicts a semiconductor process cluster architecture with various modules that interface with a vacuum transfer module 638 (VTM). The arrangement of various modules to "transfer" wafers among multiple storage facilities and processing modules may be referred to as a "cluster tool architecture" system. Airlock 630, also known as a loadlock or transfer module, interfaces with the VTM 638 which, in turn, interfaces with four processing modules 620a-620d, which may be individual optimized to perform various fabrication processes. By way of example, processing modules 620a-620d may be implemented to perform substrate etching, deposition, ion implantation, wafer cleaning, sputtering, and/or other semiconductor processes. In some embodiments, ALD and ALE are performed in the same module. In some embodiments, ALD and ALE are performed in different modules of the same tool. One or more of the substrate etching processing modules (any of 620a-620d) may be implemented as disclosed herein, i.e., for depositing conformal films, selectively depositing films by ALD, etching patterns, and other suitable functions in accordance with the disclosed embodiments. Airlock 630 and processing modules 620a-620d may be referred to as "stations." Each station has a facet 636 that interfaces the station to VTM 638. Inside each facet, sensors 1-18 are used to detect the passing of wafer 626 when moved between respective stations.

Robot 622 transfers wafer 626 between stations. In one embodiment, robot 622 has one arm, and in another embodiment, robot 622 has two arms, where each arm has an end effector 624 to pick wafers such as wafer 626 for transport. Front-end robot 632, in atmospheric transfer module (ATM) 640, is used to transfer wafers 626 from cassette or Front Opening Unified Pod (FOUP) 634 in Load Port Module (LPM) 642 to airlock 630. Module center 628 inside processing module 620a-620d is one location for placing wafer 626. Aligner 644 in ATM 640 is used to align wafers.

In an exemplary processing method, a wafer is placed in one of the FOUPs 634 in the LPM 642. Front-end robot 632 transfers the wafer from the FOUP 634 to an aligner 644, which allows the wafer 626 to be properly centered before it is etched or processed. After being aligned, the wafer 626 is moved by the front-end robot 632 into an airlock 630. Because the airlock 630 has the ability to match the environment between an ATM 640 and a VTM 638, the wafer 626 is able to move between the two pressure environments without being damaged. From the airlock 630, the wafer 626 is moved by robot 622 through VTM 638 and into one of the processing modules 620a-620d. In order to achieve this wafer movement, the robot 622 uses end effectors 624 on each of its arms. Once the wafer 626 has been processed, it is moved by robot 622 from the processing modules 620a-620d to the airlock 630. From here, the wafer 626 may be moved by the front-end robot 632 to one of the FOUPs 634 or to the aligner 644.

It should be noted that the computer controlling the wafer movement can be local to the cluster architecture, or can be located external to the cluster architecture in the manufacturing floor, or in a remote location and connected to the cluster architecture via a network. A controller as described above with respect to FIG. 5 may be implemented with the tool in FIG. 6.

EXPERIMENTAL

Experiment 1

An experiment was conducted involving etching of metal on a substrate. The substrate included a MRAM chip, with a layer of CoPt deposited over it, a layer of MgO, and a layer of CoFeB deposited over the substrate (for the magnetic tunnel junction (MTJ) structure). A Ru layer was deposited over the substrate, and a tantalum mask was deposited and patterned. This stack was used in various trials as described below. A $SiO_2$ carrier wafer was also inserted in the same tool where the substrates were processed.

In the all trials, the Ru layer was opened by wet etch. The substrate was exposed to alternating pulses of $BCl_3/Cl_2$ and Ar for an ALE process for 70 cycles. The 70 cycles involved 30 cycles of strong $Cl_2$ (20 sccm $BCl_3$/180 sccm $Cl_2$, at 60 mTorr for 2.5 seconds with a 3 second stabilization pulse of $Cl_2$ first) alternating with Ar at 200 sccm, 10 mTorr, with a plasma power of 900 W, bias applied at 50 Vb for 4 seconds (with an initial 4 second stabilization at the beginning and a bias delay of 2 seconds). The other 40 cycles involved pulses of mild $Cl_2$ (50 sccm $BCl_3$/45 sccm $Cl_2$, at 10 mTorr for 0.5 seconds without initial stabilization) and Ar (400 sccm, 10 mTorr with plasma power 900 W and bias at 50 Vb for 4 seconds, with an initial stabilization of 7 seconds and a bias delay of 2 seconds).

The resulting substrate included a thick layer of re-deposited $CoFeCl_x$ and CoPt on the stack and on the sidewalls of the tantalum hardmask. The substrates were analyzed by various imaging techniques, which revealed that Co, Ru, and Pt residues were deposited on the sidewall, while no Fe or Ta was detected on the sidewalls. The MgO layer was intact but there was some damage to the CoFe layer. Chlorine was detected at the edge of the MTJ layer and the sidewall. In this trial, the critical dimension increased due to some $SiO_2$ deposition from the $SiO_2$ carrier wafer. Some silicon from the carrier wafer also contributed to the etch but the amount of silicon was insufficient to prevent re-deposition on the sidewalls.

For both the second and third trials, after the Ru layer was opened, but prior to etching by ALE, the substrate was exposed to a silicon-containing precursor and nitrogen-containing reactant simultaneously to deposit SiN to a thickness of 6 nm over the substrate. An Ir coating was deposited on the SiN.

In the second trial, the substrate was exposed to 70 cycles of Ar sputtering only, but the substrate still resulted in some Co, Fe, and Pt re-deposition. Although the images taken of the substrate showed the SiN cap layer was intact on the substrate, some residue including Co, Fe, and Pt re-deposited over the SiN cap, thereby forming a tapered profile on the tantalum hard mask. Images of the substrates were analyzed. Here, large amounts of Fe, Co, Ru, Ta, and Pt were re-deposited on the sidewall. The results suggest that silicon by itself without a halide and/or halogen gas chemistry (such as a boron-containing halide and/or halogen gas chemistry) may not prevent sidewall deposition.

In the third trial, after the SiN layer and Ir coating were deposited, the substrate was exposed to 70 cycles of ALE in accordance with the first trial (30 cycles of strong $Cl_2$ and Ar, and 40 cycles of mild $Cl_2$ and Ar). The resulting substrate showed no re-deposition on the SiN cap and a less tapered profile. Here, images of the substrate were analyzed. Sidewall re-deposition was drastically reduced. On the Ta mask, there is little if any Fe, Co, Ta, and Pt, and a small amount of Ru. On the MTJ sidewall, there is still some Co, Fe, Ru, and Pt, but it is substantially reduced from the amount that was re-deposited in the other trials. The process conditions and deposition and etch cycles may be further tailored to minimize re-deposition. In this trial the MTJ layer was not damaged, and Cl was not detected. After the etch process, there was no SiN spacer left, which may explain the small amount of re-deposition observed on the MTJ. There was some $SiO_2$ remaining on the sidewall, which may have come from the silicon carrier wafer.

Experiment 2

A substrate including a tantalum barrier layer, a PtMn layer deposited on the tantalum layer, and a CoFeB layer deposited on the PtMn layer, with a tantalum hard mask was processed. A SiN layer was deposited over the substrate and a thin Cr coating was deposited over the SiN cap. The substrate was exposed to alternating pulses of $BCl_3/Cl_2$ and Ar, and no re-deposition was shown on the resulting SiN cap after etch.

Experiment 3

An experiment was conducted with $SiCl_4$ on a blanket CoFe wafer. The first trial involved $SiCl_4$/Ar exposure. The second trial involved $BCl_3/Cl_2$ and Ar in alternating pulses in an ALE mode. The third trial involved $SiCl_4$ ALD in 1, 2, 3, then 4 cycles, followed by 1 cycle of $BCl_3/Cl_2$ and Ar alternated in ALE to perform an ALD-ALE mode.

The results suggest that both the CW $SiCl_4$/Ar and ALE $BCl_3/Cl_2$/Ar do not etch CoFe, while the process involving ALD-ALE etched CoFe. This suggests that the combination of ALD-ALE processes as described herein effectively etch these metal compounds that typically yield non-volatile byproducts. It is expected that similar approaches would also etch CoPd, CoPt, and PtMn.

Experiment 4

Figure 7:
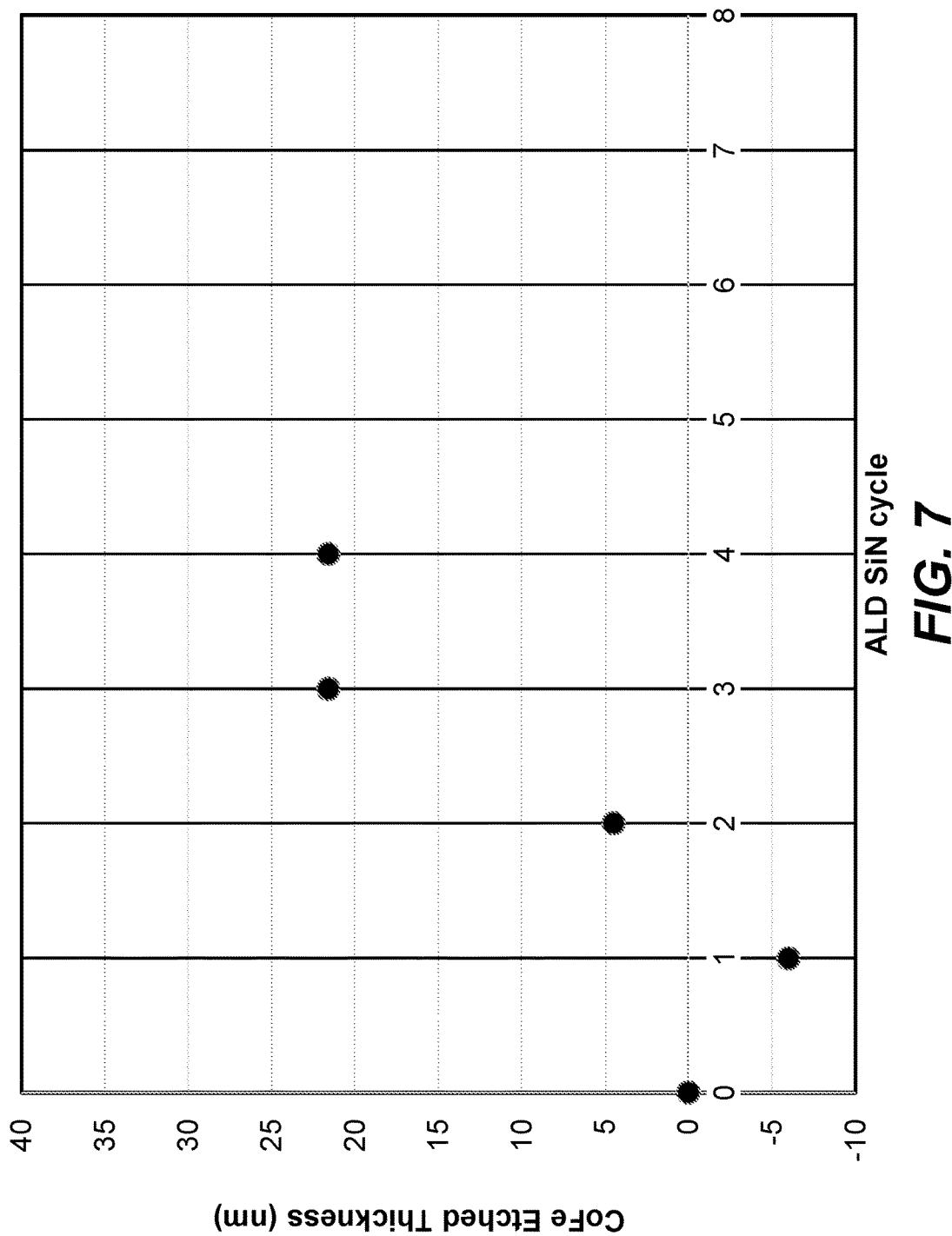
FIG. 7 is a graph showing etched thickness of CoFe from an experiment conducted in accordance with disclosed embodiments.

An experiment was conducted involving a substrate. The substrate was exposed to 50 sccm of $SiCl_4$ and 200 sccm $N_2$ at 60 mTorr for 5 seconds then 200 sccm $N_2$ at 1200 W and 60 W at 40 mTorr to deposit a SiN layer over the substrate. The substrate was then exposed to 1 cycle of ALE including 20 sccm $BCl_3$ and 180 sccm $Cl_2$ at 60 mTorr for 2.5 seconds, and 200 sccm Ar at 900 W and a bias of 60 Vb at 50 mTorr for 4 seconds. Sixty total cycles were performed for each trial. The first trial involved 1 SiN ALD cycle followed by 1 ALE cycle 60 times. The second trial involved 2 SiN ALD cycles followed by 1 ALE cycle, 60 times. The third trial involved 3 SiN ALD cycles followed by 1 ALE cycle, 60 times. The fourth trial involved 4 SiN ALD cycles and 1 ALE cycle, 60 times. With 3 cycles of ALD SiN, all 21.6 nm of CoFe was etched. Each ALD SiN cycle thickness was expected to be 0.5 Å to 1 Å. The amount of CoFe etched versus the number of ALD SiN cycles is depicted in FIG. 7. As shown, at 3 cycles of ALD SiN, all of the CoFe was etched.

Experiment 5

An experiment was conducted involving a substrate with a tantalum barrier layer, a PtMn layer, a CoFeB layer, and a tantalum hard mask. The substrate was sputtered with Ar, and prior to performing a halide and/or halogen gas etch, a $TiO_2$ protective layer was deposited conformally over the substrate to cap the substrate. Subsequently, the substrate was exposed to cycles of $BCl_3/Cl_2$ and Ar pulses in an ALE process. The resulting substrate exhibited no re-deposition of Co, Fe, Pt, and Ta on the sidewalls or on the $TiO_2$ cap.

Experiment 6

An experiment was conducted involving a substrate with a ruthenium metal layer, a PtMn layer, a CoFeB layer, and a tantalum hard mask. Prior to performing a halide and/or halogen gas etch, a $SiO_2$ protective layer was deposited conformally over the substrate to cap the substrate. Subsequently, the substrate was exposed to cycles of $BCl_3/Cl_2$ and Ar pulses in an ALE process. The resulting substrate exhibited no re-deposition of Co, Fe, Pt, and Ta on the sidewalls or on the $SiO_2$ cap.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. An apparatus for processing a substrate comprising one or more layers, the apparatus comprising:
   (a) one or more process chambers, each process chamber comprising a chuck;
   (b) one or more gas inlets into the process chambers and associated flow-control hardware;
   (c) at least one RF power supply for generating a plasma; and
   (d) a controller having at least one processor and a memory, wherein the at least one processor and the memory are communicatively connected with one another, the at least one processor is at least operatively connected with the flow-control hardware and the at least one RF power supply, and
   the memory stores computer-executable instructions for controlling the at least one processor to at least control the flow-control hardware and the at least one RF power supply for:
   (i) causing introduction of a halogen-containing gas for a duration sufficient to substantially saturate a surface of the substrate;
   (ii) causing introduction of an activation gas and generation of a plasma to etch the one or more layers of the substrate; and
   (iii) providing of a reactive material that is reactive with both the halogen-containing gas and a material of the one or more layers on the substrate to one of the one or more process chambers during (i) and (ii) to form a volatile species,
   wherein (i)-(iii) are performed without breaking vacuum.

2. The apparatus of claim 1, wherein the instructions for providing the reactive material that is reactive with both the halogen-containing gas and a material of the one or more layers on the substrate to form a volatile species comprises instructions for depositing a material selected from the group consisting of silicon-containing material, titanium-containing material, germanium-containing material, tin-containing material, carbon-containing material, and combinations thereof.

3. The apparatus of claim 1, wherein the halogen-containing gas is selected from the group consisting of $Cl_2$, $BCl_3$, $BBr_3$, $BI_3$, $F_2$, $BF_3$, $Br_2$, $I_2$ and combinations thereof.

4. The apparatus of claim 1, wherein the memory further comprises instructions for repeating (iii) after (i) and (ii) are performed in two or more cycles.

5. An apparatus for processing a substrate comprising one or more layers, the apparatus comprising:
  (a) one or more process chambers, each process chamber comprising a chuck;
  (b) one or more gas inlets into the process chambers and associated flow-control hardware;
  (c) at least one RF power supply for generating a plasma; and
  (d) a controller having at least one processor and a memory, wherein the at least one processor and the memory are communicatively connected with one another, the at least one processor is at least operatively connected with the flow-control hardware, and the at least one RF power supply and the memory stores computer-executable instructions for controlling the at least one processor to at least control the flow-control hardware and the at least one RF power supply for:
    (i) causing introduction of a halogen-containing gas for a duration sufficient to substantially saturate a surface of the substrate;
    (ii) causing introduction of an activation gas and activation of an activation source to etch the one or more layers of the substrate, wherein the instructions for causing activation of an activation source comprises instructions for causing generation of a plasma; and
    (iii) causing introduction of a precursor gas and reducing agent to deposit a reactive material that is reactive with both the halogen-containing gas and a material of the one or more layers of the substrate.

6. The apparatus of claim 5, wherein the precursor gas is a silicon-containing gas.

7. The apparatus of claim 5, wherein the reactive material is selected from the group consisting of silicon-containing material, titanium-containing material, germanium-containing material, tin-containing material, carbon-containing material, and combinations thereof.

8. The apparatus of claim 5, wherein (i)-(iii) are performed without breaking vacuum.

9. The apparatus of claim 5, wherein the halogen-containing gas is selected from the group consisting of $Cl_2$, $BCl_3$, $BBr_3$, $BI_3$, $F_2$, $BF_3$, $Br_2$, $I_2$ and combinations thereof.

10. The apparatus of claim 5, wherein the memory further comprises instructions for repeating (iii) after (i) and (ii) are performed in two or more cycles.

* * * * *